(12) United States Patent
Kley

(10) Patent No.: US 7,960,695 B1
(45) Date of Patent: Jun. 14, 2011

(54) MICROMACHINED ELECTRON OR ION-BEAM SOURCE AND SECONDARY PICKUP FOR SCANNING PROBE MICROSCOPY OR OBJECT MODIFICATION

(76) Inventor: Victor B. Kley, Berkley, CA (US)

( * ) Notice: Subject to any disclaimer, the term of this patent is extended or adjusted under 35 U.S.C. 154(b) by 587 days.

(21) Appl. No.: 11/383,356

(22) Filed: May 15, 2006

Related U.S. Application Data

(60) Provisional application No. 60/723,643, filed on Oct. 4, 2005, provisional application No. 60/711,899, filed on Aug. 25, 2005, provisional application No. 60/687,269, filed on Jun. 3, 2005, provisional application No. 60/681,720, filed on May 16, 2005, provisional application No. 60/680,687, filed on May 13, 2005.

(51) Int. Cl.
*G01N 13/16* (2006.01)
(52) U.S. Cl. .............. 250/306; 250/216; 73/105
(58) Field of Classification Search ............ 250/306
See application file for complete search history.

(56) References Cited

U.S. PATENT DOCUMENTS

| | | | |
|---|---|---|---|
| 4,403,834 A | 9/1983 | Kley | |
| 4,435,616 A | 3/1984 | Kley | |
| 4,456,731 A | 6/1984 | Caporossi et al. | |
| 4,589,030 A | 5/1986 | Kley | |
| 4,604,648 A | 8/1986 | Kley | |
| 4,782,327 A | 11/1988 | Kley et al. | |
| 4,806,776 A | 2/1989 | Kley | |
| 4,935,728 A | 6/1990 | Kley | |
| 5,235,187 A * | 8/1993 | Arney et al. ............ 850/58 | |
| 5,239,297 A | 8/1993 | Kley | |
| 5,377,552 A | 1/1995 | Kley | |
| 5,751,683 A | 5/1998 | Kley | |
| 5,756,997 A | 5/1998 | Kley | |
| 5,828,532 A * | 10/1998 | Ahlert et al. ............ 360/322 |
| 5,844,251 A * | 12/1998 | MacDonald et al. ........ 257/10 |
| 6,232,597 B1 | 5/2001 | Kley | |
| 6,242,734 B1 | 6/2001 | Kley | |
| 6,243,474 B1 * | 6/2001 | Tai et al. ............ 381/174 |
| 6,252,226 B1 | 6/2001 | Kley | |
| 6,265,711 B1 | 7/2001 | Kley | |
| 6,337,479 B1 | 1/2002 | Kley | |
| 6,339,217 B1 | 1/2002 | Kley | |
| 6,353,219 B1 | 3/2002 | Kley | |
| 6,507,533 B2 | 1/2003 | Sato | |
| 6,797,952 B2 * | 9/2004 | Kaito et al. ............ 850/26 |
| 6,819,698 B1 * | 11/2004 | Vogler ............ 372/55 |
| 2004/0060904 A1 * | 4/2004 | Herschbein et al. ............ 216/63 |

OTHER PUBLICATIONS

Chang Liu, Assistant Professor (bio), University of Illinois at Urbana-Champaign.

(Continued)

*Primary Examiner* — Phillip A Johnston
(74) *Attorney, Agent, or Firm* — Kilpatrick Townsend & Stockton LLP

(57) ABSTRACT

An e-beam or ion beam imaging and exposure system is built into the end of an AFM cantilever which images using the scanning capabilities built into the AFM. In one embodiment, a boron doped diamond cold cathode is formed into the cantilever with an associated accelerating electrode and secondary electron collection electrode. The assembly is brought within a few nanometers of the object to be imaged or exposed using the AFM. One or more gas channels built into the cantilever assembly provide a positive pressure of inert gas to prevent oxidative erosion of the cold cathode and can bleed any surface charge build up on the sample surface. After secondaries are collected the cantilever is moved to the next area to be exposed.

19 Claims, 31 Drawing Sheets

OTHER PUBLICATIONS

CPO Ltd., Charged Particle Optics Programs—"The 'benchmark test' files," at URL reference www.electronoptics.com/ benchmar. htm.

Doll et al., "Low-energy electron beam focusing in self-organized porous alumina vacuum windows," *Applied Physics Letters* 76:24, pp. 3635-3637 (2000).

Munro's Electron Beam Software Ltd., Source Graphics output for FE gun and for Pierce gun, URL references www.mebs.co.uk /fegun.htm and www.mebs.co.uk /pierce.htm.

Niell, "Electron Gun Beam Extraction with MOSFETs," Proc. 1999 Particle Accelerator Conference, New York, at URL reference accelconf.web.cern.ch/ AccelConf/ p99/ PAPERS/ MOP143.PDF.

Pierce, "My Work with Vacuum Tubes at Bell Laboratories," reprinted form SMEC (now SMECC) "Vintage Electrics," 3:1 (1991), at URL reference www.smecc.org/ john_r_pierce_electron_tubes.htm.

SRIM, "Historical Review", downloaded at http://www.srim.org/ SRIM/History/HISTORY.htm on Nov. 29, 2006.

SRIM,"Particle Interactions with Matter", downloaded at srim.org on Nov. 29, 2006.

Tel Aviv University, "The Principle of Electrostatic Accelerator (EA) FEL Operation," at URL reference www.eng.tau.ac.il/ research/ FEL/ 0a.html.

Vaughan et al., "Synthesis of a hollow-beam pierce gun," IEEE Trans. Electron Devices, vol. ED-34, Feb. 1987 (Abstract), at URL reference adsabs.harvard.edu/ cgi-bin/ nph-bib_query?bibcode= 1987ITED...34..468V& amp;db_key=INST.

V.P. Yakovlev et al., "100 MW electron gun for a 34.3 GHz magnicon," Proc. 2001 Particle Accelerator Conference, Chicago, at URL reference epaper.kek.jp/ p01/ PAPERS/ MPPH115.PDF.

\* cited by examiner

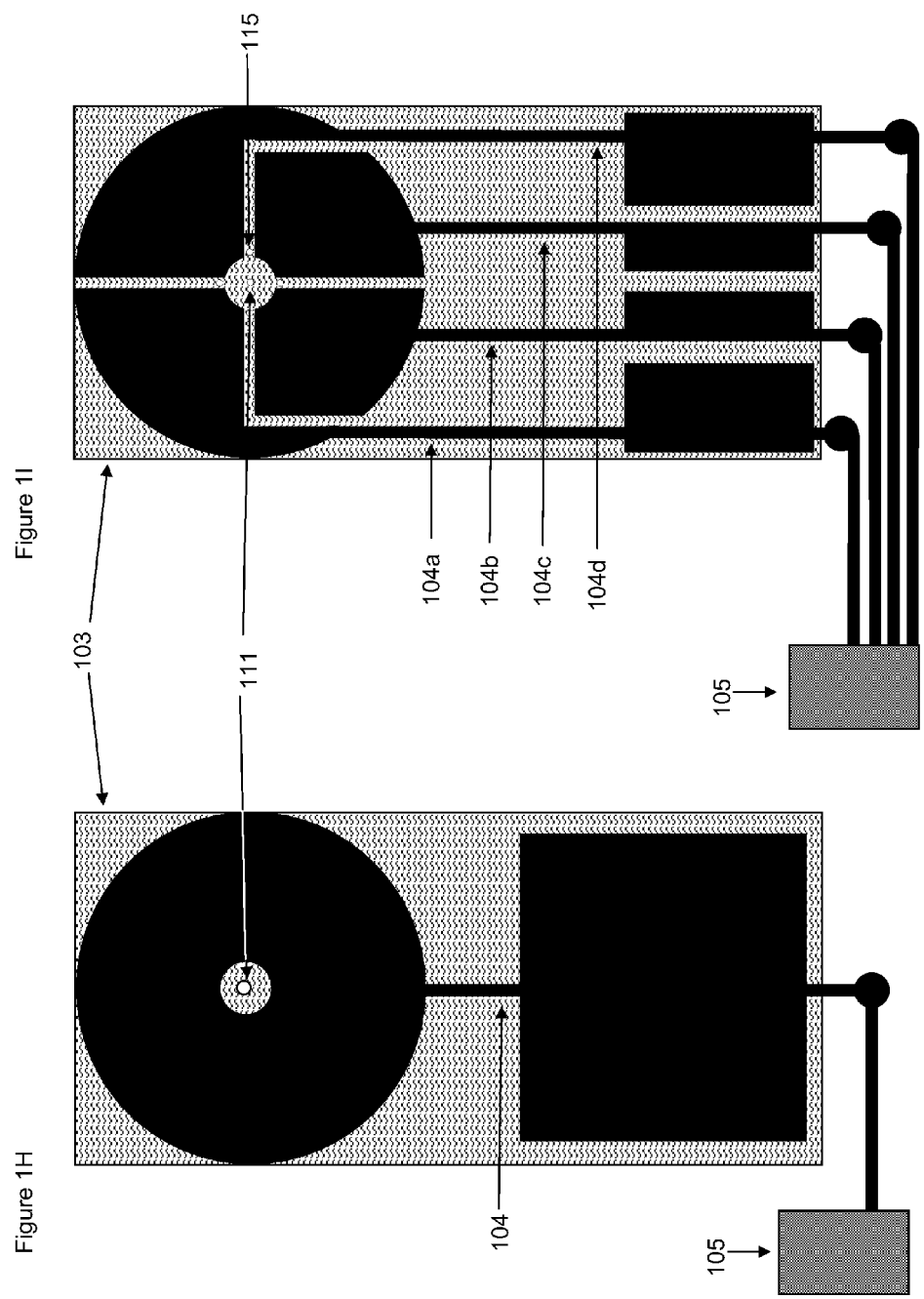

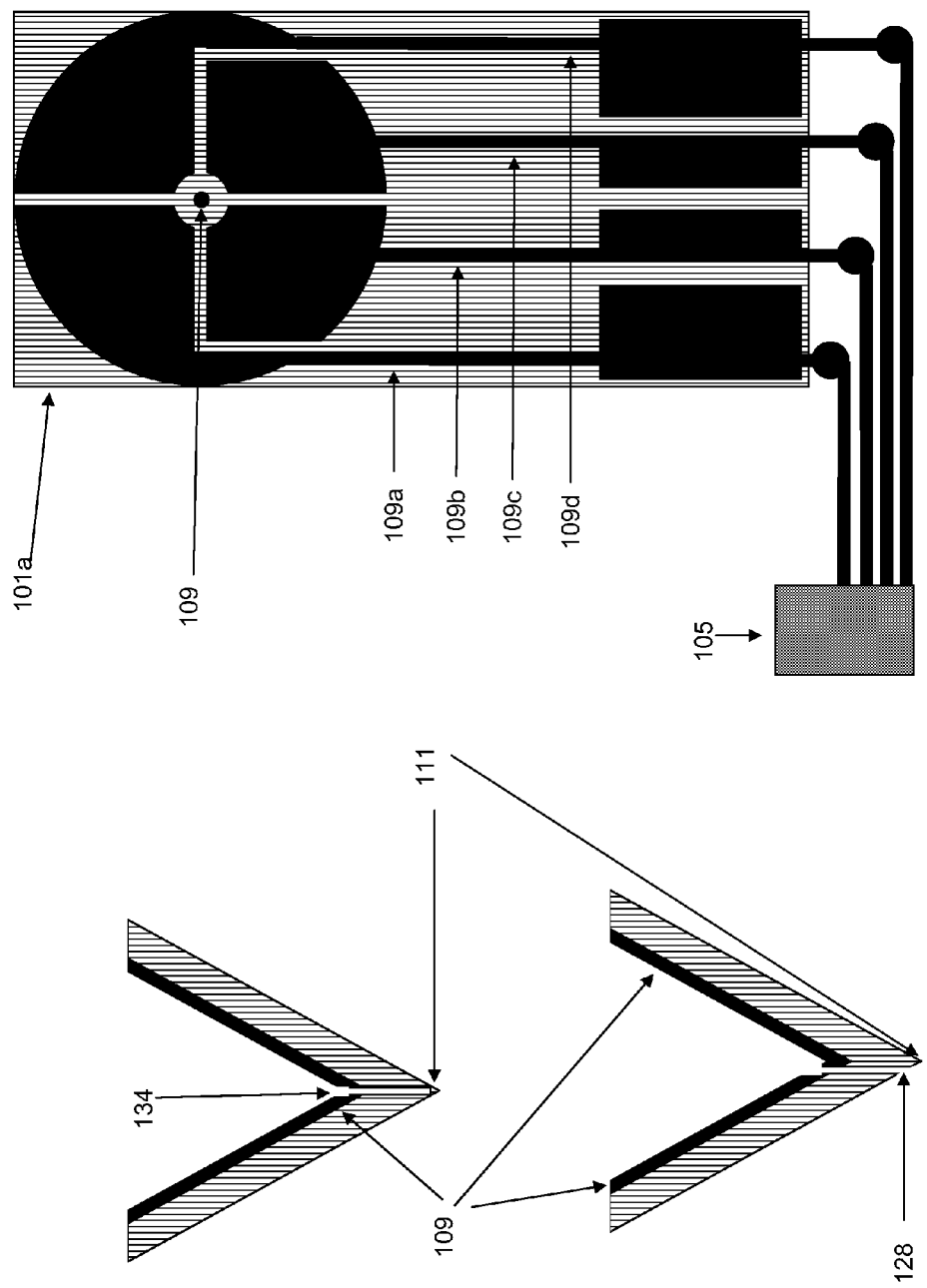

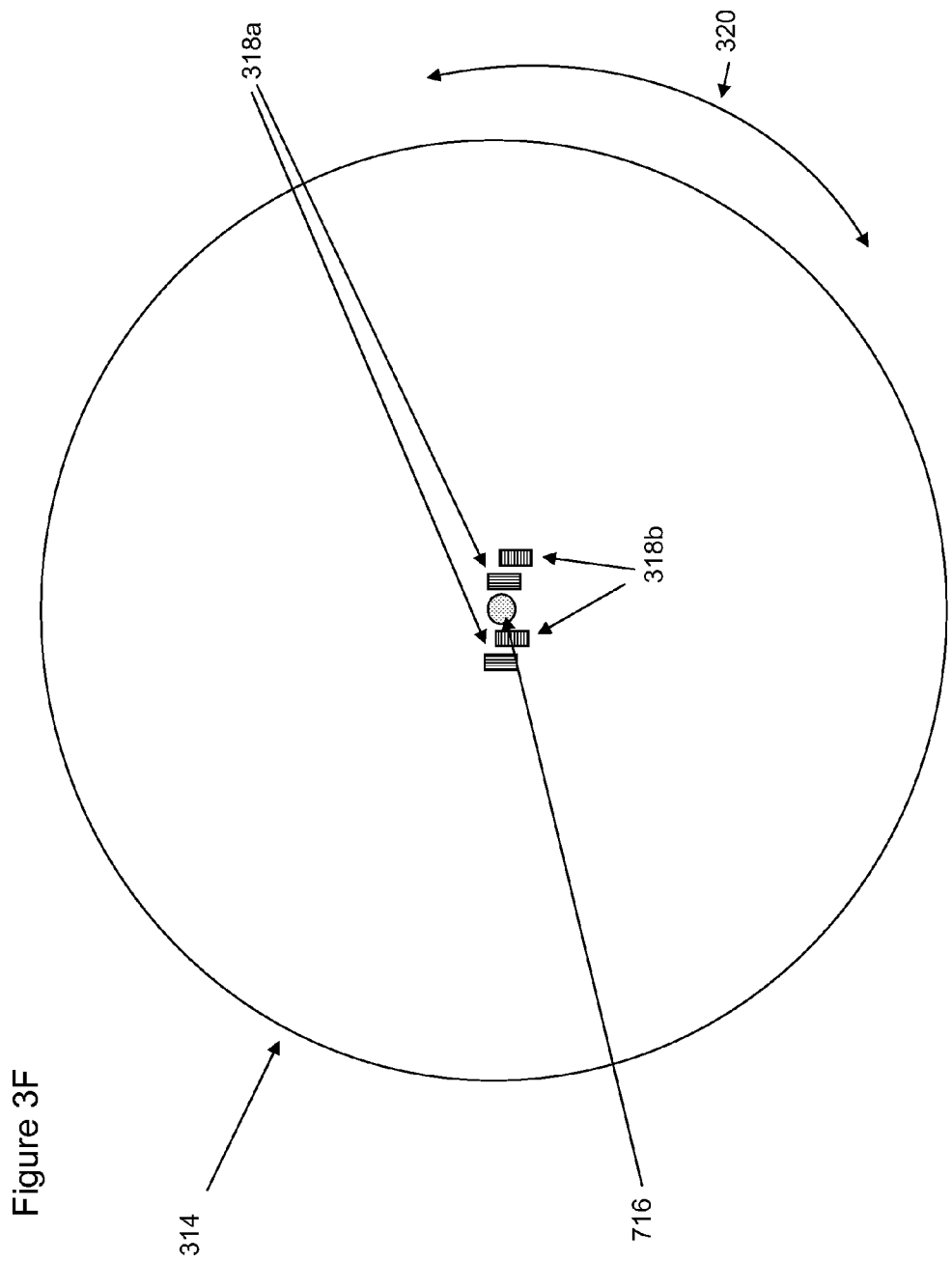

MICROMACHINED ELECTRON OR ION-BEAM SOURCE AND SECONDARY PICKUP FOR SCANNING PROBE MICROSCOPY OR OBJECT MODIFICATION

CROSS-REFERENCES TO RELATED APPLICATIONS

This application claims the benefit of the following five U.S. Provisional Patent Applications:
  Application No. 60/680,687, filed May 13, 2005, entitled "Micromachined Electron or Ion Beam Source and Secondary Pickup for Scanning Probe Microscopy or Object Modification";
  Application No. 60/681,720, filed May 16, 2005, entitled "Micromachined Electron or Ion Beam Source and Secondary Pickup for Scanning Probe Microscopy or Object Modification";
  Application No. 60/687,269, filed Jun. 3, 2005, entitled "Micromachined Electron or Ion Beam Source and Secondary Pickup for Scanning Probe Microscopy or Object Modification";
  Application No. 60/711,899, filed Aug. 25, 2005, entitled "Manufacturing of Micro-Objects Such As Miniature Diamond Tool Tips"; and
  Application No. 60/723,643, filed Oct. 4, 2005, entitled "Micromachined Electron or Ion Beam Source and Secondary Pickup for Scanning Probe Microscopy or Object Modification."
The respective disclosures of these applications, including any attachments and/or appendices thereto, are incorporated herein by reference for all purposes.

BACKGROUND OF THE INVENTION

The present invention relates generally to the manufacture and use of electron beam and/or ion beam devices built into the end of a SPM cantilever or tip shaft for measuring, testing, inspecting, examining, modifying, analyzing objects in industrial, semiconductor, chemical, biological and scientific applications.

Manufacturing and other processes pertaining to scanning probe microscopy, nanomachining, micromachining, machining, optics, biotechnology, and biomedicine benefit from electron and/or ion beam imaging and modification but are not well served by speed, sample preparation, cost and destructive nature of present day electron beam, ion beam, and dual ion and electron beam systems. Especially in the biological world and increasingly in the semiconductor world high beam energies required for classical e-beam or ion beam systems are injurious or deadly to the subject, inspection requirements or production material under there influence.

BRIEF SUMMARY OF THE INVENTION

It therefore is an object of some embodiments of the present invention to provide a system for low energy high resolution electron beam or ion beam devices which operate outside a vacuum. It is a further object of some embodiments of this invention to incorporate the beam technology into the final tip structure of a SPM (scanning probe microscope) while retaining the ability to function as a SPM. Another object of some embodiments of this invention is to provide a reliable and low cost method for the manufacture of such devices. It is yet another object of some embodiments of this invention to support extremely fast pulse operation of the beam by using a very fast optical gate. It is yet another object of some embodiments of this invention to provide provision for high voltage (energy) operation at the limits of the insulators available for construction. It is yet another object of some embodiments of this invention to permit operation of the beam devices in a fluid such as water by providing a fluid delivery means to control or eliminate the exposure of the beam components. An additional object of some embodiments is to provide a sealed system for electron beams in which there is a vacuum or chosen gas. It is still another object of some embodiments of this invention to permit simultaneous SPM scanning including AFM, MFM, LFM and other SPM techniques well known in the art. Yet another object of some embodiments is to provide sufficient shielding from x-rays and other penetrating radiation to create noise at the sample plane, further this shielding may be a function of design beam energy.

In an embodiment of the invention, a SPM system for inspecting, analyzing, probing, manipulating, modifying, inducing chemical or biological or catalytic change uses an ion beam or electron beam incorporated into the fully functional SPM cantilever and/or tip shaft. A lithographically defined miniature electron beam and/or ion beam device with its own fluid supply (gas or liquid) is created. Provision is also made for creating a point beam emitter that is extremely small using a carbon nanotube grown or attached to the emitter structure. The device includes a means for scanning the electron or ion beam very quickly without moving the scan system of the SPM.

In some embodiments, e beam or ion beam imaging and exposure system built into the end of an AFM cantilever which images using the scanning capabilities built into the AFM. One embodiment is based on a boron doped diamond cold cathode formed into the cantilever with an associated accelerating electrode and secondary electron collection electrode. The assembly is brought within a few nanometers of the object to be imaged or exposed using the normal AFM approach system built into the AFM. One or more gas channels are built into the cantilever assembly to provide a low to medium positive pressure of inert gas (typically argon) to prevent oxidative erosion of the cold cathode. The slight ionization of the inert gas also serves to bleed any surface charge build up on the sample surface. After secondaries are collected the cantilever is moved to the next area to be exposed. In some variations a modest local x, y or z scan is implemented at the tip itself before the cantilever is translated (or in some instances the sample and/or the cantilever is translated) to the next region.

Imaging can be made at ambient pressures, humidity and temperatures on any sample including viable tissues. Setup is quick and sample exchange quick and simple. Large areas may be locally inspected, exposed or imaged without the limitation of vacuum chambers.

In an embodiment for the electron beam only a very small, thin window is created which permits the entire assembly to be sealed in a gas such as (Argon with 1% hydrogen) or a vacuum. In an additional embodiment a long high-Z path is provided in the tip shaft of the device such as to shield the sample area from penetrating radiation at the maximum design operating energy (voltage).

A further understanding of the nature and advantages of the present invention may be realized by reference to the remaining portions of the specification and the drawings.

BRIEF DESCRIPTION OF THE DRAWINGS

FIG. 1H is a bottom plan view of a SPM cantilever end and AFM tip apex, and circular disk secondary electron collector and acceleration electrode (anode) according to principles of the present invention.

FIG. 1I is a bottom plan view of a SPM cantilever end and AFM tip apex, and four quadrant circular disk secondary electron collector and acceleration electrode (anode) according to principles of the present invention.

FIG. 1J is a top plan view of a SPM beam acceleration and steering electrode/bond layer incorporating the tip on its diamond substrate cantilever end (or component for the tip end) with a side cross section view of the tip end with seal and tip end with offset through hole.

FIG. 3F is top view of a magnetic pole arrangement which induces elliptical polarization in the EM waves created by the FEL.

DETAILED DESCRIPTION OF THE INVENTION

Figure 1A:
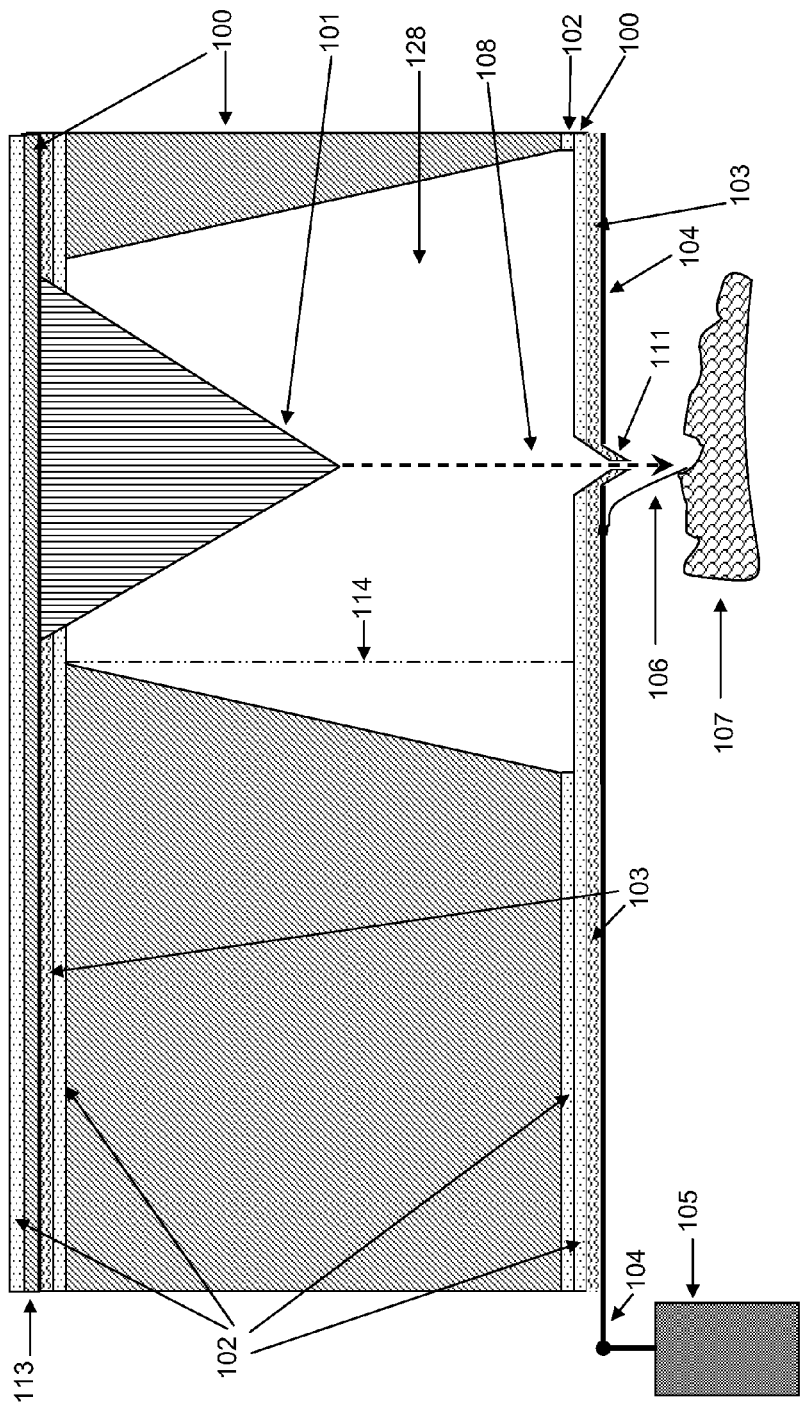
FIG. 1A is a side cross section view of a SPM cantilever end with an Electron or Ion beam source and AFM tip apex, secondary electrons and collector according to principles of the present invention.

FIG. 1A shows an alternative form for an electron and/or ion beam (108) device with integrated scanning tip (111). In operation this collection of elements is part of a complete SPM tip assembly (200, shown in FIGS. 2L and 2M) and the electrical connections (113, 104) and with fluid channel 114 (also shown in FIG. 1G) feeding cavity (128) with He, Ar, $N_2$, kerosene, megaohm resistivity water, oil, silicone oil, or $CO_2$ or any other gas or liquid at positive pressures in air and negative pressures in a suitable fluid (example as above). In one mode of operation a gas Ar at 1.1 atmospheres flows from some feed source through the tip assembly and out through micromachined passage 114 into the cavity 128 and out through the hole in tip 111. After scavenging all or most $O_2$ from the cathode 101 which may be intrinsic diamond, boron doped diamond, nitrogen doped diamond, phosphorous doped diamond, any metal, silicon carbide, silicon nitride, carbon or boron nanotubes, or any material suitable for electron emission or ion generation or acceleration and focus has a voltage applied to it through the doped conductive diamond, doped silicon and/or metal connecting layer 113 which at sufficiently high voltage produces beam 108. Beam 108 then strikes object 107 causing secondary electron 106 to be emitted which travels to collector 104. Collector 104 is grounded when the power pulse is applied to emitter 101 and then switches to a current mode in time to collect 106. The quantity of secondary emissions and the angle of emission can be used as a signal in conjunction with the motion of the beam over the sample surface to make an electron image of the subject. In addition the SPM tip 111 which may be used to measure or modify surface morphology, friction/stiction, height, magnetic field, chemical reaction, heat, light, tunnel current, conductivity, emit light or other electromagnetic radiation, apply or remove fluids or solids, catalyze reactions, change magnetic domains or any other parameter or task for which a SPM may be used, insures that the beam is within a few nanometers of the surface 107 to be measured or modified, or undergo beam induced chemical or physical change. Voltages are separated in FIG. 1A by insulators 102, and 103 which may be silicon dioxide and/or silicon nitride and/or hafnium oxide, and/or aluminum oxide, and/or intrinsic diamond, and/or any other material useful in preventing current leakage or discharge.

Figure 1B:
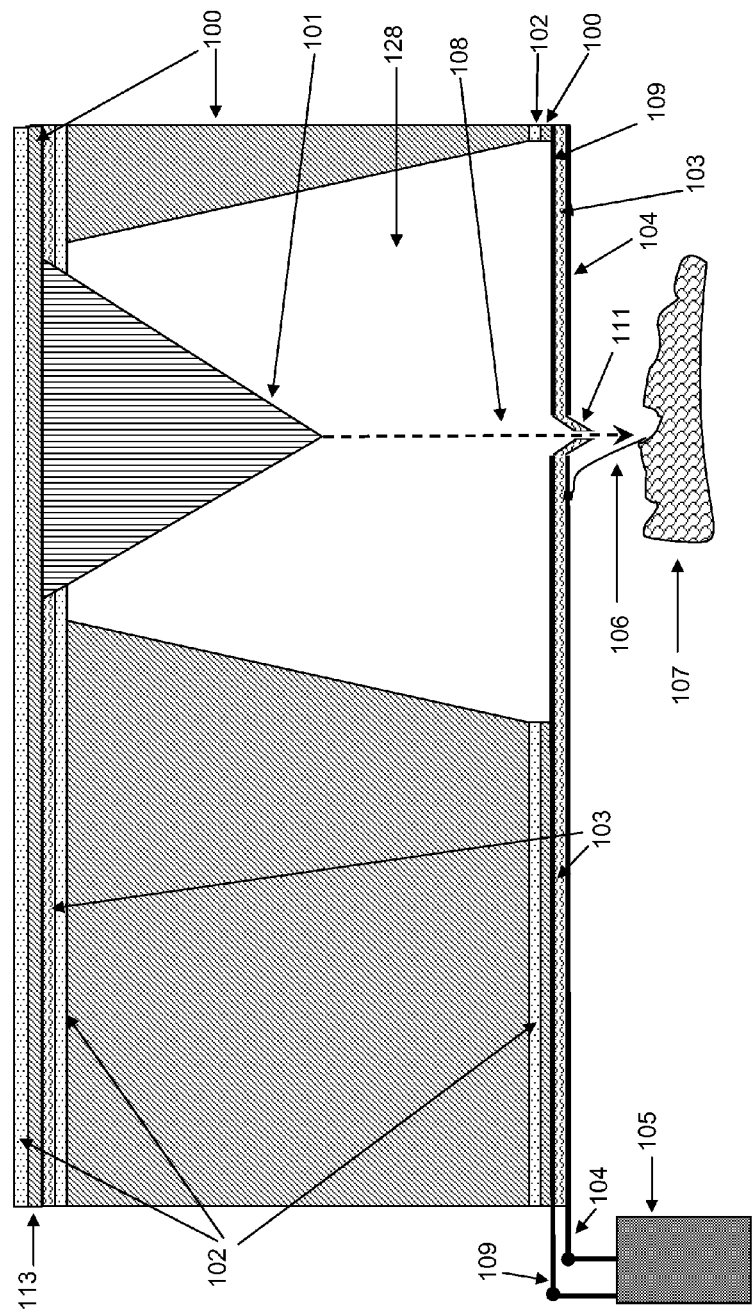
FIG. 1B is a side cross section view of a SPM cantilever end with an Electron or Ion beam source and AFM tip apex, secondary electrons and collector according to principles of the present invention.

FIG. 1B is an alternative form in which an additional layer 100 is added to provide a silicon surface to which to bond a metal layer 109 acting as the accelerator or anode of the beam system allowing the continuous monitoring of secondary electrons (106). In this embodiment the insulating layer between electrodes 109 and 104 is typically silicon nitride (103) and also forms the scan tip with beam passage 111. System controller and electronics drive 105 is also connected to both 109, 104 and 113.

Figure 1C:
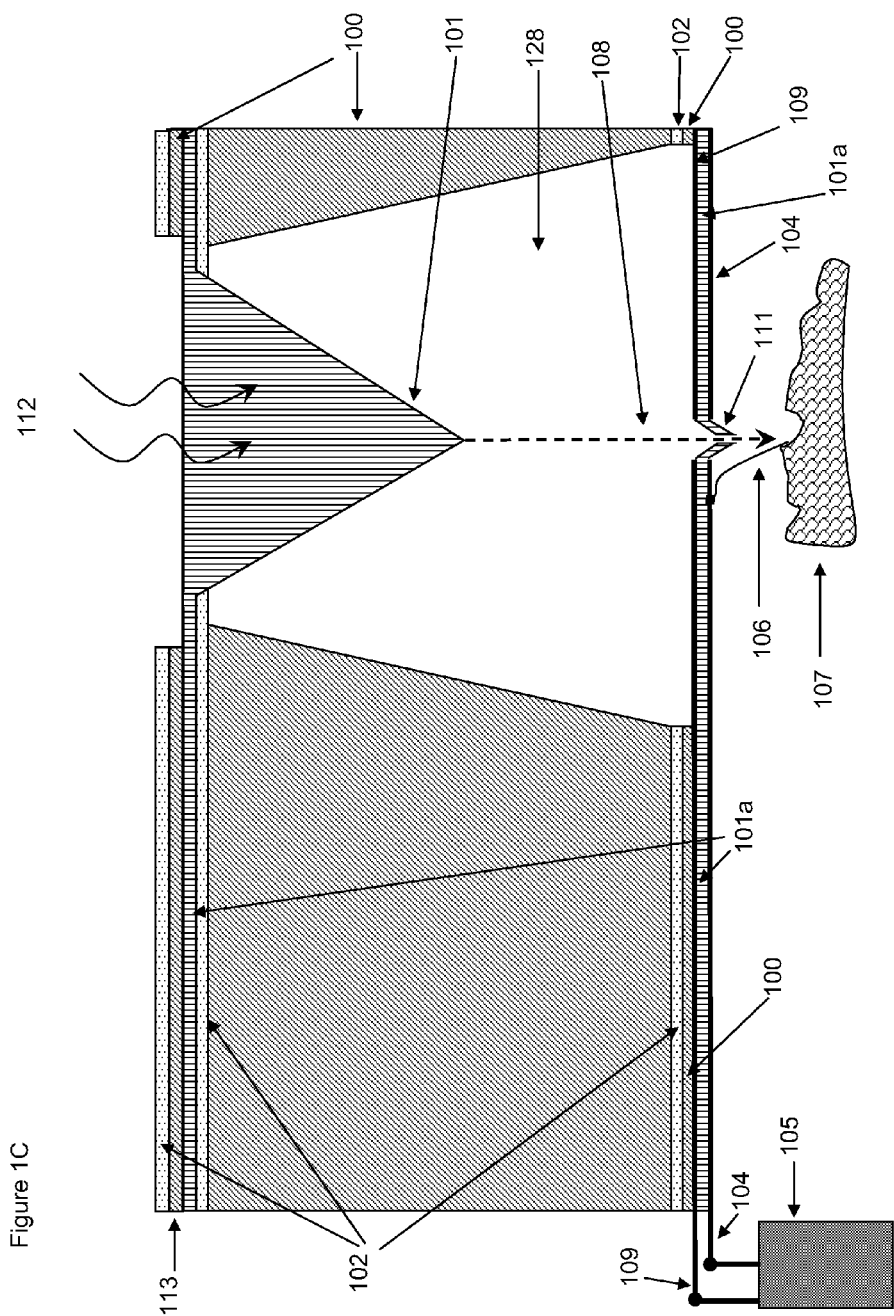
FIG. 1C is a side cross section view of a SPM cantilever end with an Electron or Ion beam source, electromagnetic switching of an intrinsic diamond cathode and AFM tip apex, secondary electrons and collector according to principles of the present invention.

FIG. 1C is yet another embodiment of the invention in which the silicon nitride layer 103 between the control and collection electrodes is replaced with intrinsic diamond (101a) as an insulator. Immediately above the cathode 101 the layer 113 is thinned to transparency or removed to expose the intrinsic diamond 101 to trigger ultraviolet or x-ray electromagnetic pulse 112. Electrons are displaced in the 101 lattice and the diamond conducts for a very short time (pulse width dependent) rapid switching, chopping or modulation of the electron or ion beam (108).

Figure 1D:
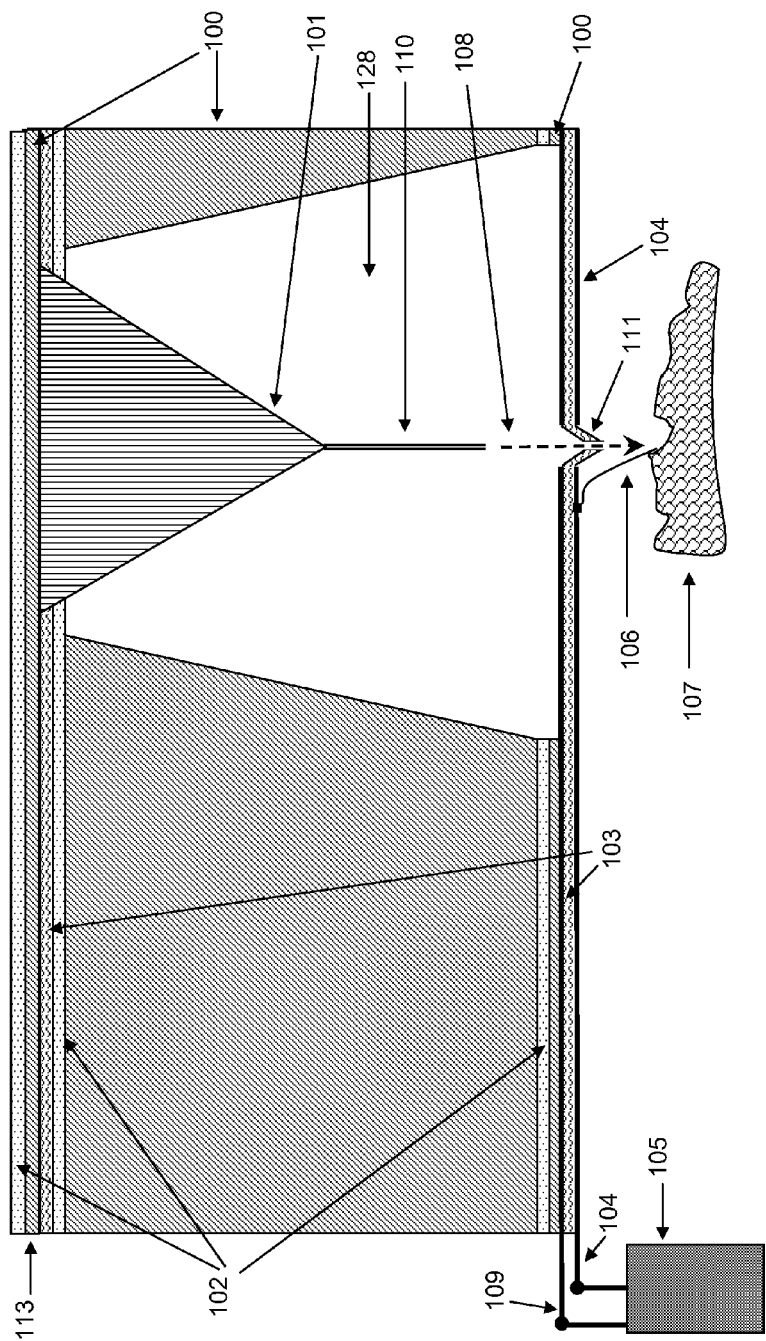
FIG. 1D is a side cross section view of a SPM cantilever end with an Electron or Ion beam source, carbon nanotubes cathode and AFM tip apex, secondary electrons and collector according to principles of the present invention.

FIG. 1D shows a cathode (101) in which a conducting nanotube (110) such as a carbon nanotubes has been attached or grown on the point of the cathode structure (101) otherwise this alternative embodiment is similar to FIG. 1B. By this means a very narrow beam (108) may be created. The point of the cathode material may be ion implant with iron or any material known to promote and seed carbon nanotubes growth and the carbon nanotubes is grown with growth conditions well known in the art and similar to those used for CVD diamond growth as described elsewhere (see, e.g., patents referenced below).

Figure 1E:
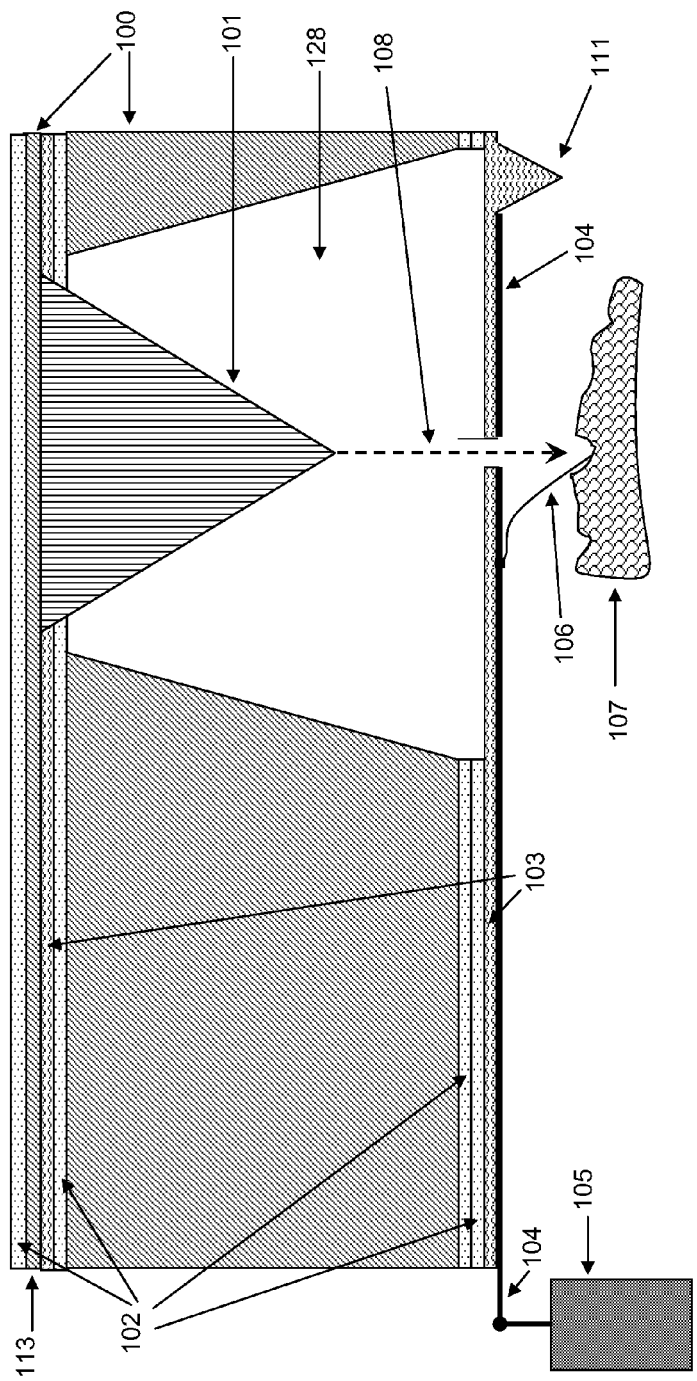
FIG. 1E is a side cross section view of a SPM cantilever end with an Electron or Ion beam source, secondary electrons and collector according to principles of the present invention.

FIG. 1E is an alternate form of FIG. 1A in which a SPM tip (111) is grown at the end of the cantilever and made to the optimal sharpness for resolution while the beam (108) operates at a fixed offset through its central aperture.

Figure 1F:
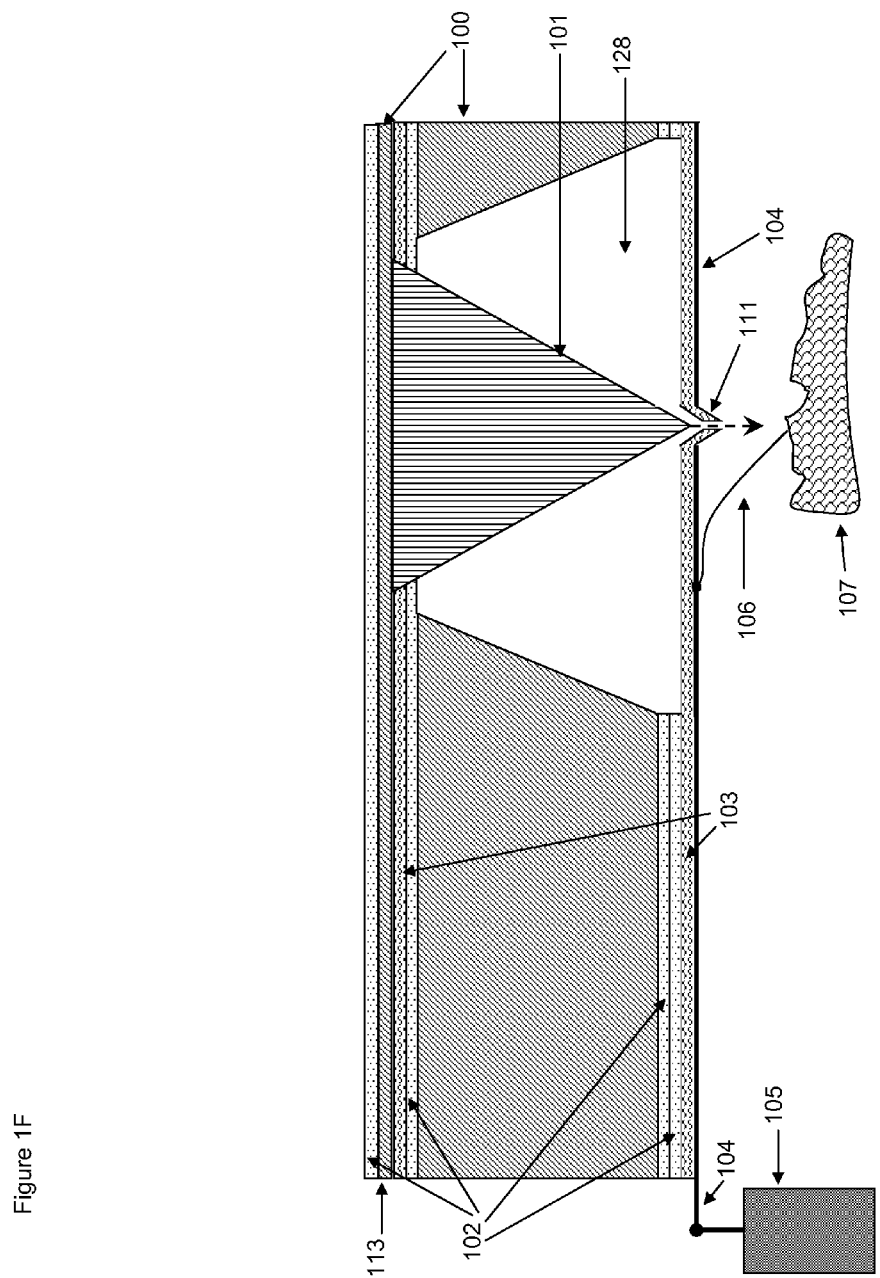
FIG. 1F is a side cross section view of a SPM cantilever end with an Electron or Ion beam source and AFM tip apex, secondary electrons and collector according to principles of the present invention.

FIG. 1F shows an embodiment of FIG. 1A in which the gap between the cathode (101) and anode (104) is made very small for work with low energy electrons or ions.

Figure 1G:
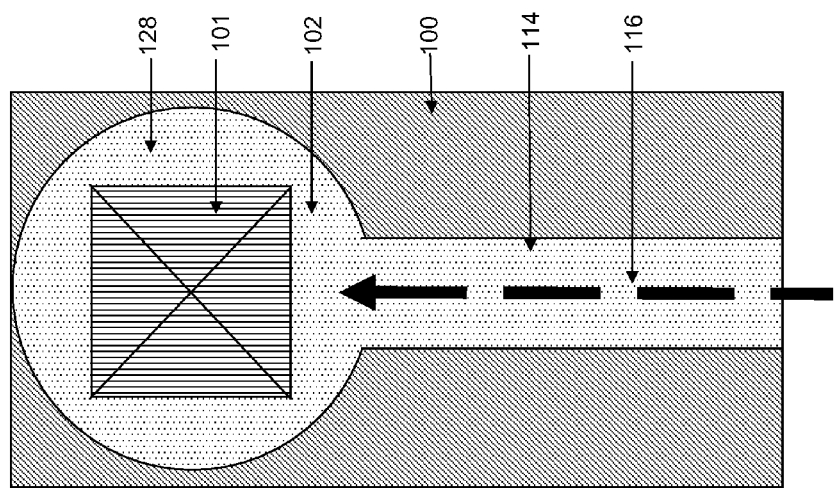
FIG. 1G is a bottom cross section view of a SPM cantilever end with an Electron or Ion beam source and cathode, fluid delivery channel according to principles of the present invention.

FIG. 1G shows a cross section of the bottom beam head structure on the cantilever between the layers 102, 103, 109, 104 and clearly showing the passage (114) and the fluid (116) flowing toward the beam chamber. The cathode 101 and silicon form 100 are attached to the insulating layer 102.

FIG. 1H is a cross section view of insulator (103 or 101a) with collection (104) and/or anode (104 or 109) metal layer. The central hole tip (111) is located and centered on the electrode.

FIG. 1I shows a cross section incorporating four quadrant anode (104a-d) and/or collector (104). Connections are shown to controller 105 for all quadrants. In some cases one or more sets of such connections are required so that if the quadrant anode is use with a quadrant collector on a different layer 8 connections to 105 will be required.

FIG. 1J shows the tip structure with a high-Z coating 109 and the tip 111 thinned internally to make a low-Z (carbon) window 134 to electrons. Alternately the tip may be machined with a coaxial through channel 128. The high-Z material is not electrically connected to steering and acceleration electrodes (109a-d) shown, it may however have its own ground or acceleration connection (not shown). However if no steering electrodes are used as described above then the central high-Z material may be electrically connected to the single acceleration electrode 109.

Figure 1K:
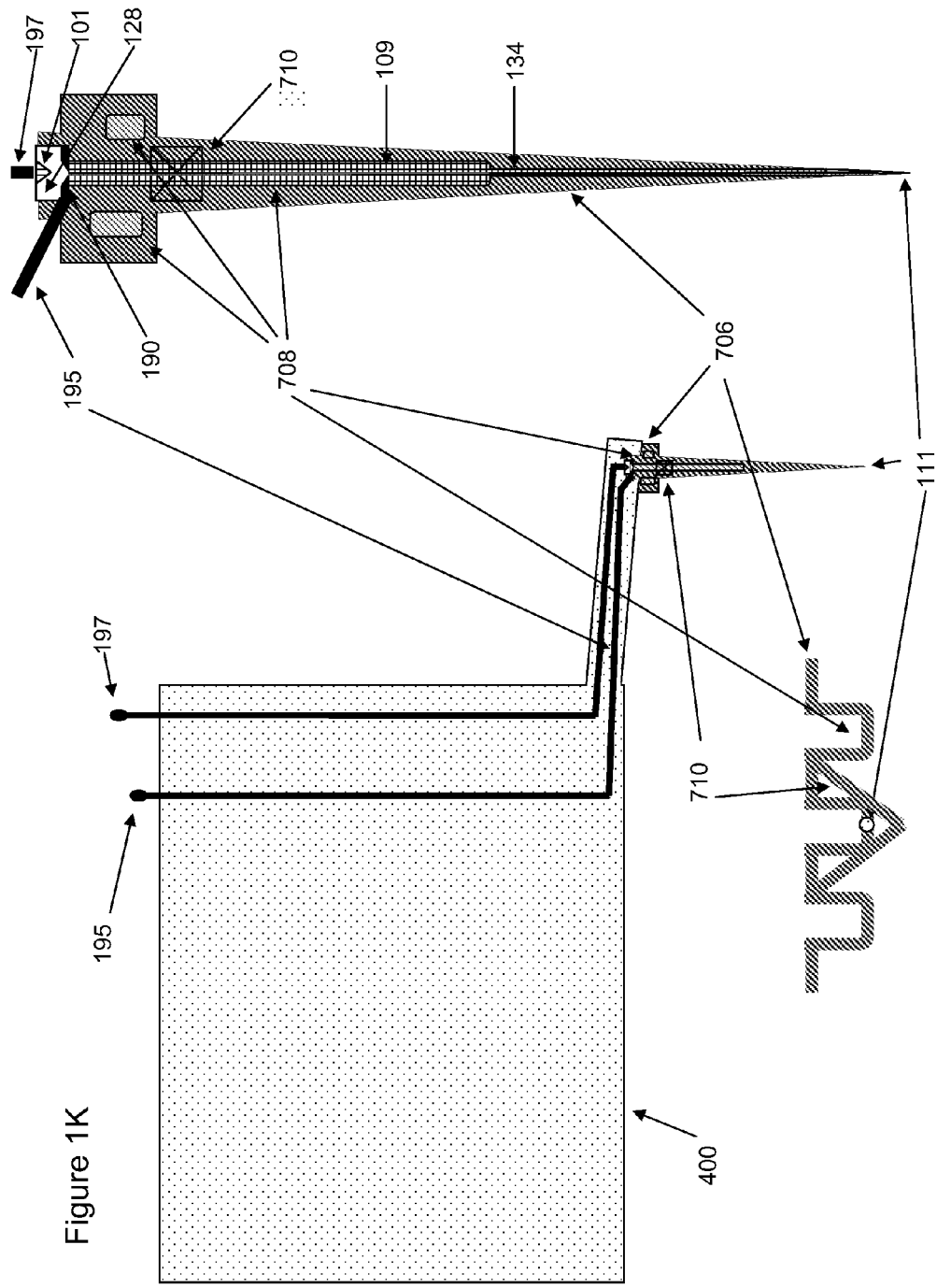
FIG. 1K is a side plan view of a SPM beam and tip shaft showing the addition of a electron or ion channel in a high-Z material (such as platinum, gadolinium or germanium).

FIG. 1K shows an intrinsic diamond tip shaft 710 and electron beam emission structures cathode 101, anode 190 and electrical connections 195, 197. In addition there is a narrow clear passage 134 from the chamber 128 through the Pierce angle of 22.5 degrees anode 190 to the tip 111 which stops just short of the end of the tip. The passage goes through high-Z material 109 which may be any heavy radiation absorptive material such as platinum, gold, lead, germanium, gallium etc. The length of the tip shaft is chosen to damp the highest energy x-rays produced at the anode shielding the area from around the tip end sample. Further the material comprising the shielding may be alternating magnetic and non-magnetic material spaced in order to induce a specific wiggle in the passage of the electron beam so as to generate a specific narrow electromagnetic radiation which may be used to further analyze, measure, chemically activate, catalyze, modify or interact with the object.

Still further the material comprising the shielding may be conductive and so arranged in one or more regions to accelerate the electron beam within the cavity. This effect may include the use of a Cyclotron like series of "Dees" and associated magnetic structures to further accelerate the spiraling, radiating e-beam toward the tip exit window.

Figure 2A:
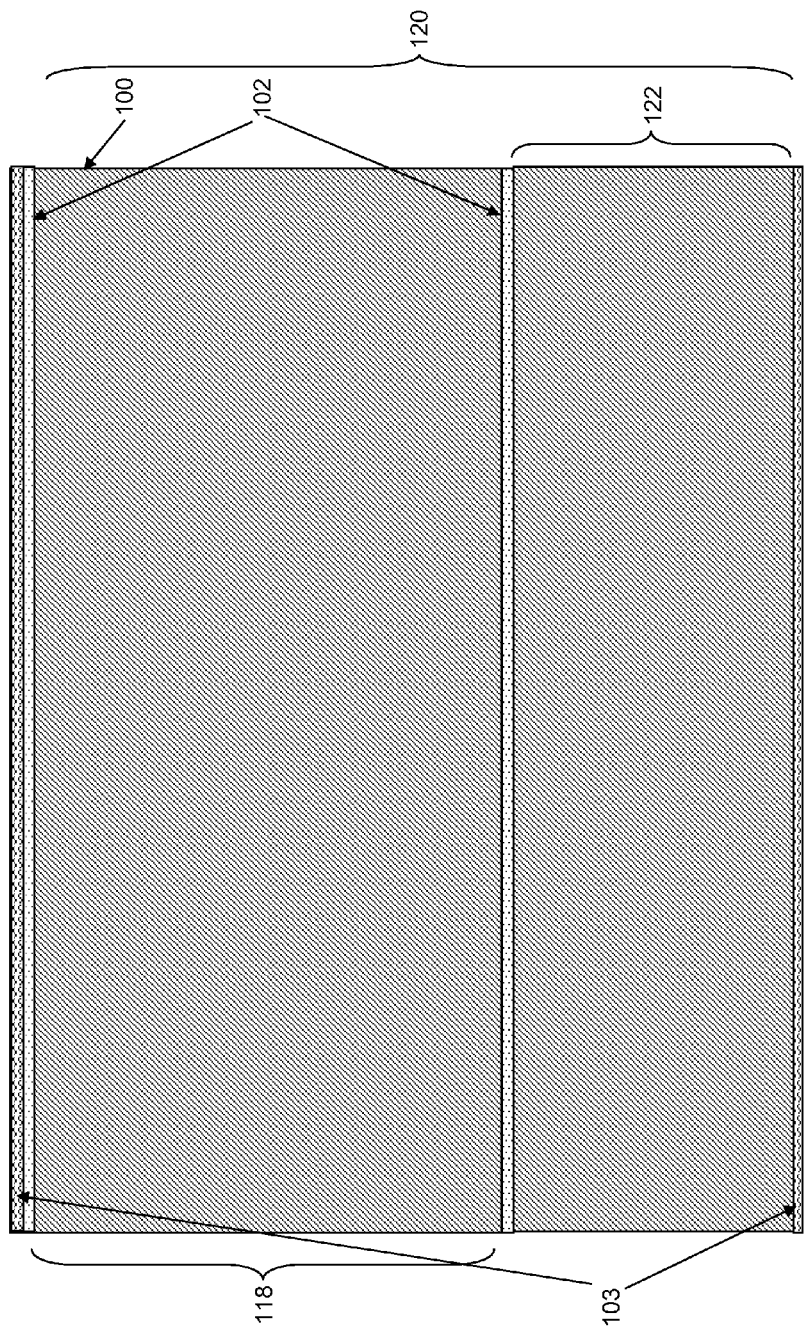
FIG. 2A is a side cross section view of a first step in a process for lithographically creating a beam device according to an embodiment of the present invention.

FIG. 2A shows a side cross section view of the first step in process for creating the beam structure. SOI wafer 120 consisting of device layer 118, oxide layer 102 between 118 and handle layer 122 is placed in a silicon dioxide furnace and an additional oxide layer is grown on the top exposed side of 118. The wafer is then placed in a silicon nitriding furnace and a nitride layer is grown on both sides of the wafer. The wafer is patterned on the 118 exposed side and the etch resist developed to expose the etch areas.

Figure 2B:
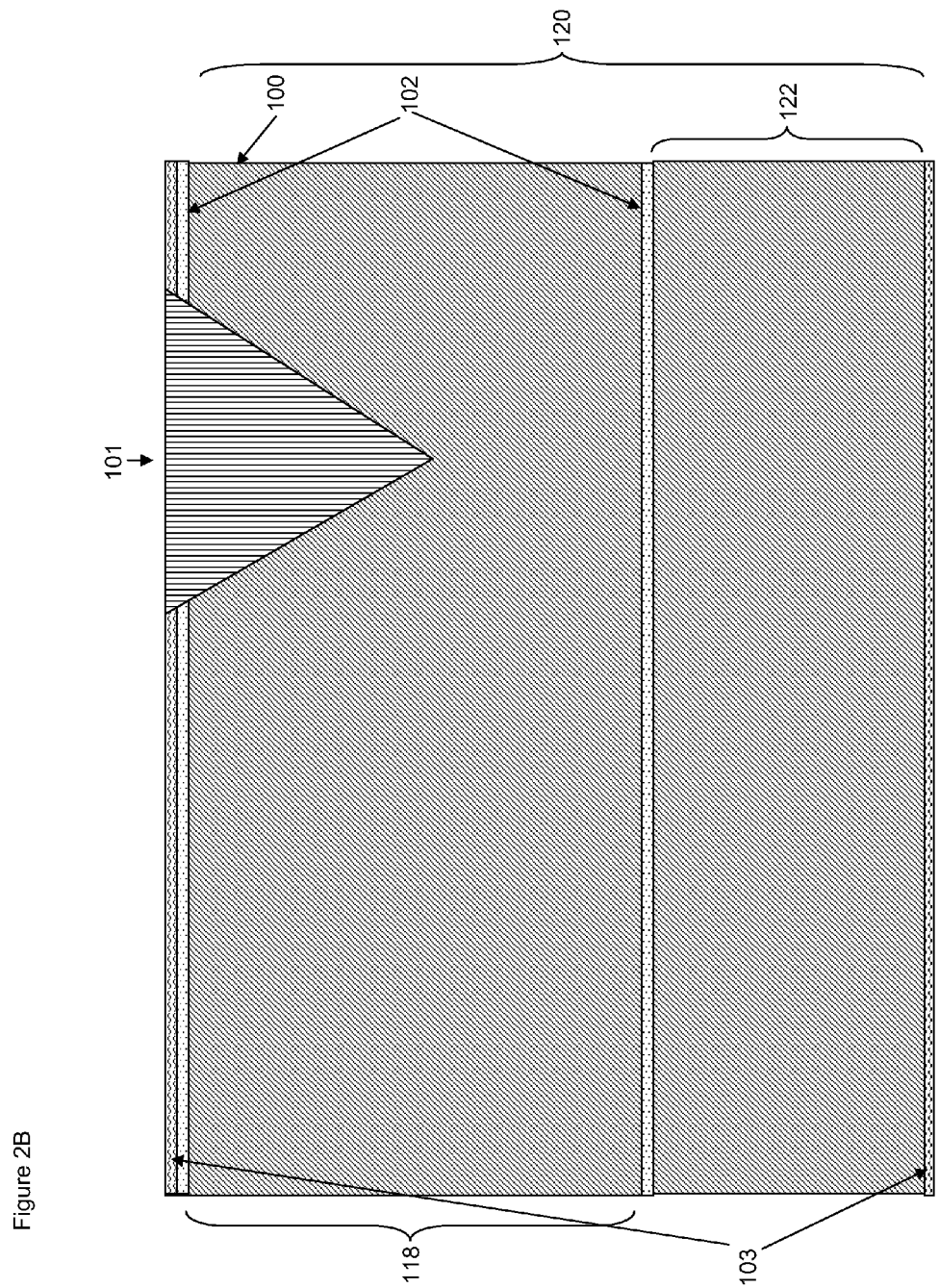
FIG. 2B is a side cross section view of a second step in a process for lithographically creating a beam device according to an embodiment of the present invention.

FIG. 2B shows a side cross section view of the second step wafer after one or more materials 101 have been grown in the square self limiting pit wet etched in the 100 silicon of 118. This pit acts as a mold for the material of 101 producing a molded four sided pyramid sharp to 10 nanometers or better. The material of 101 may be diamond, conductive diamond, diamond like carbon, amorphous diamond, silicon carbide, silicon nitride, metals, gold, silver, palladium, platinum, tungsten, molybdenum, aluminum, titanium, chromium, iron, manganese, metal carbides, metal nitrides, metal oxides, boron nitride, aluminum oxide or any other suitable material. In one embodiment the pit is coated with a thin layer of silicon nitride and then a small hole is burned or milled by e-beam, ion beam or other means at the point of the pit and then the pit is coated with iron, then over coated with chromium. Then after further steps in the process (FIG. 2F) one or more carbon nanotubes are grown through the hole. Excess carbon nanotubes are trimmed and the process steps completed to yield a beam device with a carbon nanotubes tip. This method may also be used to grow carbon nanotubes on tips for general SPM use as described in previous applications filed by the present inventor.

Figure 2C:
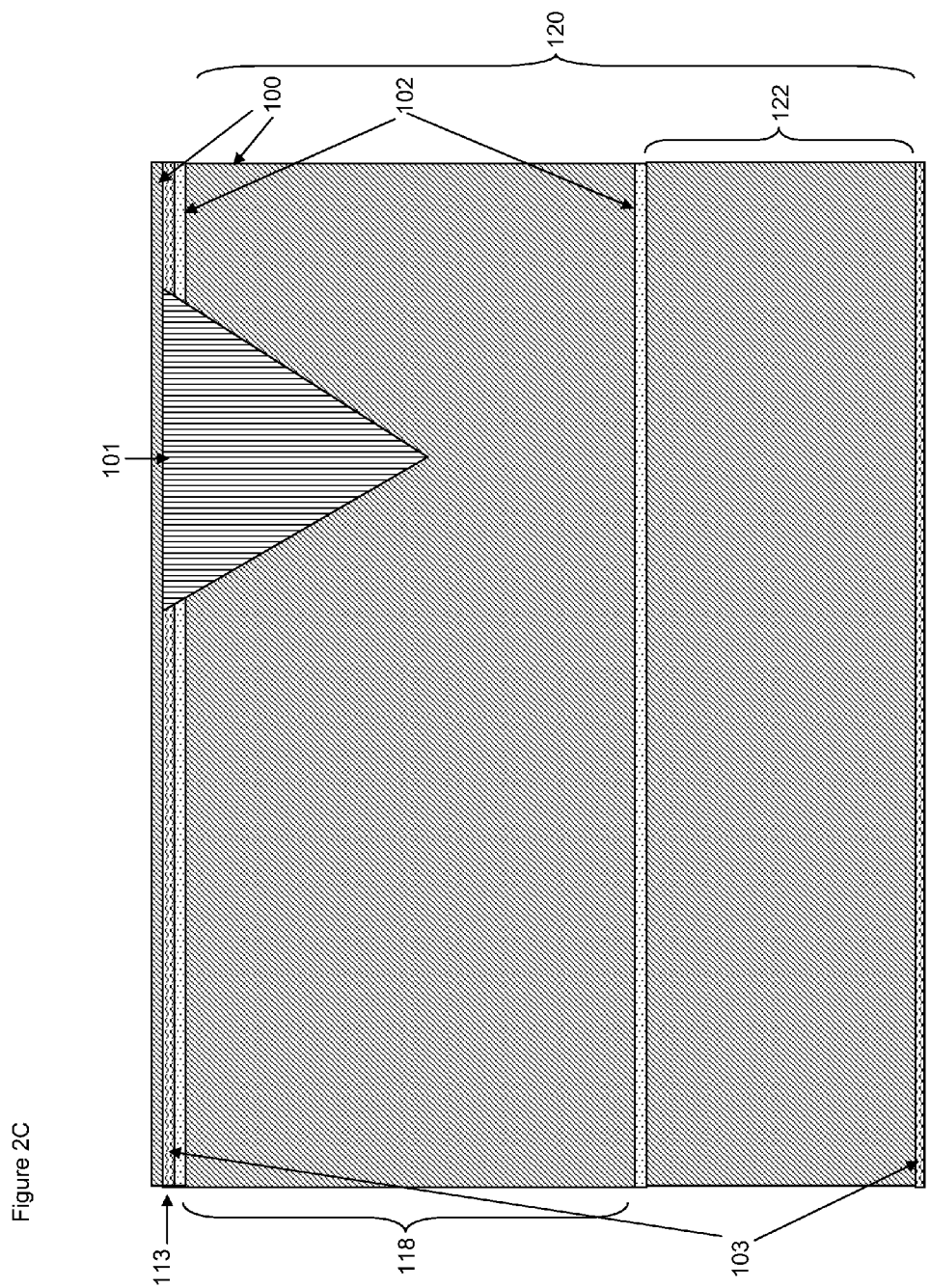
FIG. 2C is a side cross section view of a third step in a process for lithographically creating a beam device according to an embodiment of the present invention.

FIG. 2C shows the third step in which a thin silicon layer (100) is coated over the top of device layer 118 and the beam cathode 101. This will be used to form an oxide to bond to the upper body component of the tip assembly in a later process step. The top of layer 118 can also be coated with a metal layer for bonding or to make external connections. The silicon coat can be intrinsic (high resistivity) or highly conductive in place of or in addition to the metal connecting and/or bonding layer.

Figure 2D:
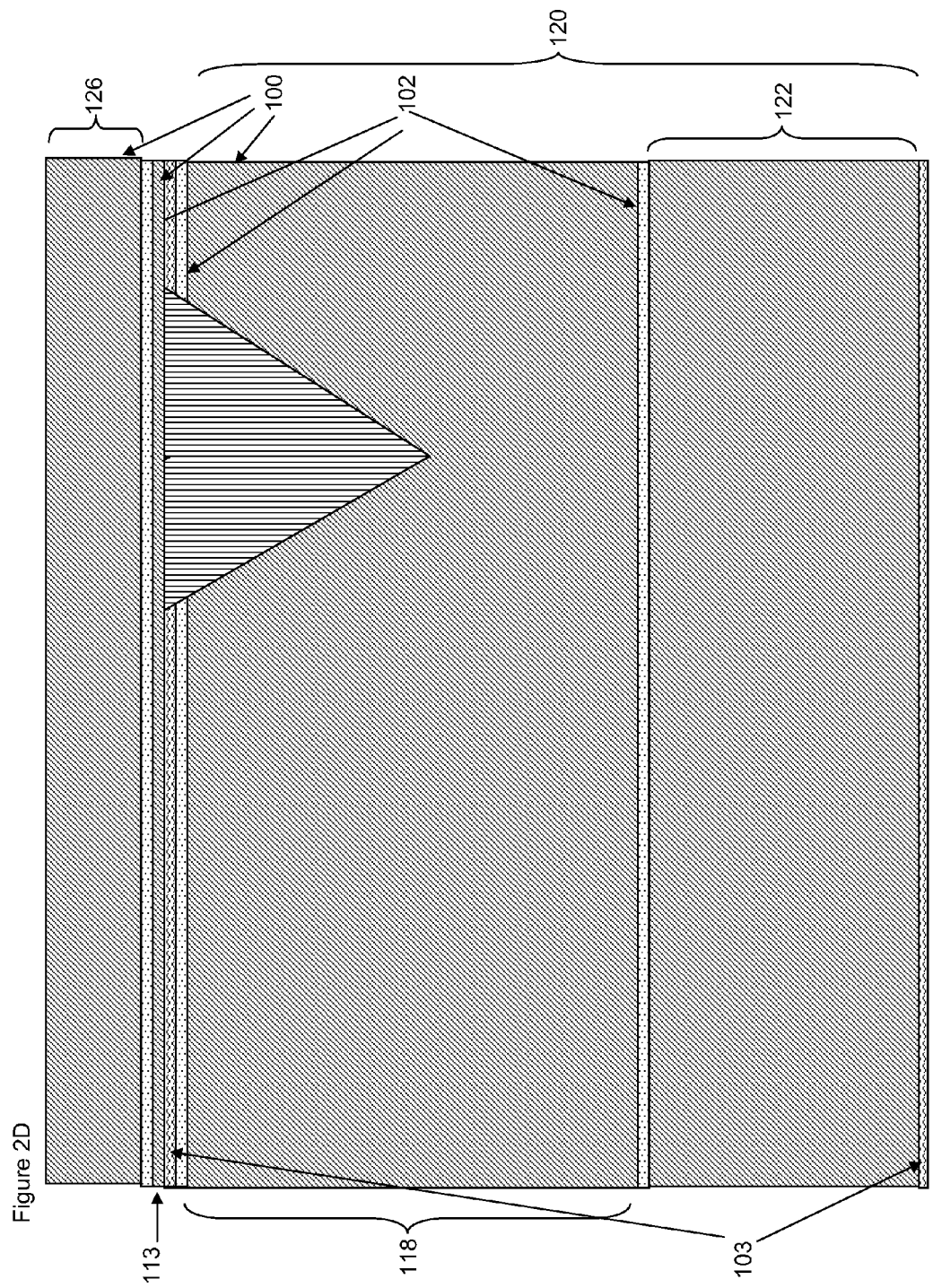
FIG. 2D is a side cross section view of a fourth step in a process for lithographically creating a beam device according to an embodiment of the present invention.

FIG. 2D shows a single side or double side wafer (126) bonded to the result of FIG. 2C by an oxide and/or metal and/or silicon to silicon bond process or an adhesive process all well known in the art. The metal bond may be a Ti, Ni, Cu bond as taught in earlier patents and applications by this inventor or a low temp bond like Cr, Au or Cr, Ag, Au or Ti, Au, or Ti, Ag, Au. The wafer 126 is prepared with a fluid reservoir and fluid connector to external sources (206, FIG. 2L) as described in earlier patents and applications by this inventor. Waver 126 is also pre-patterned with a connecting passage to the fluid delivery passage 114 in layer 118 formed in FIG. 2F.

Figure 2E:
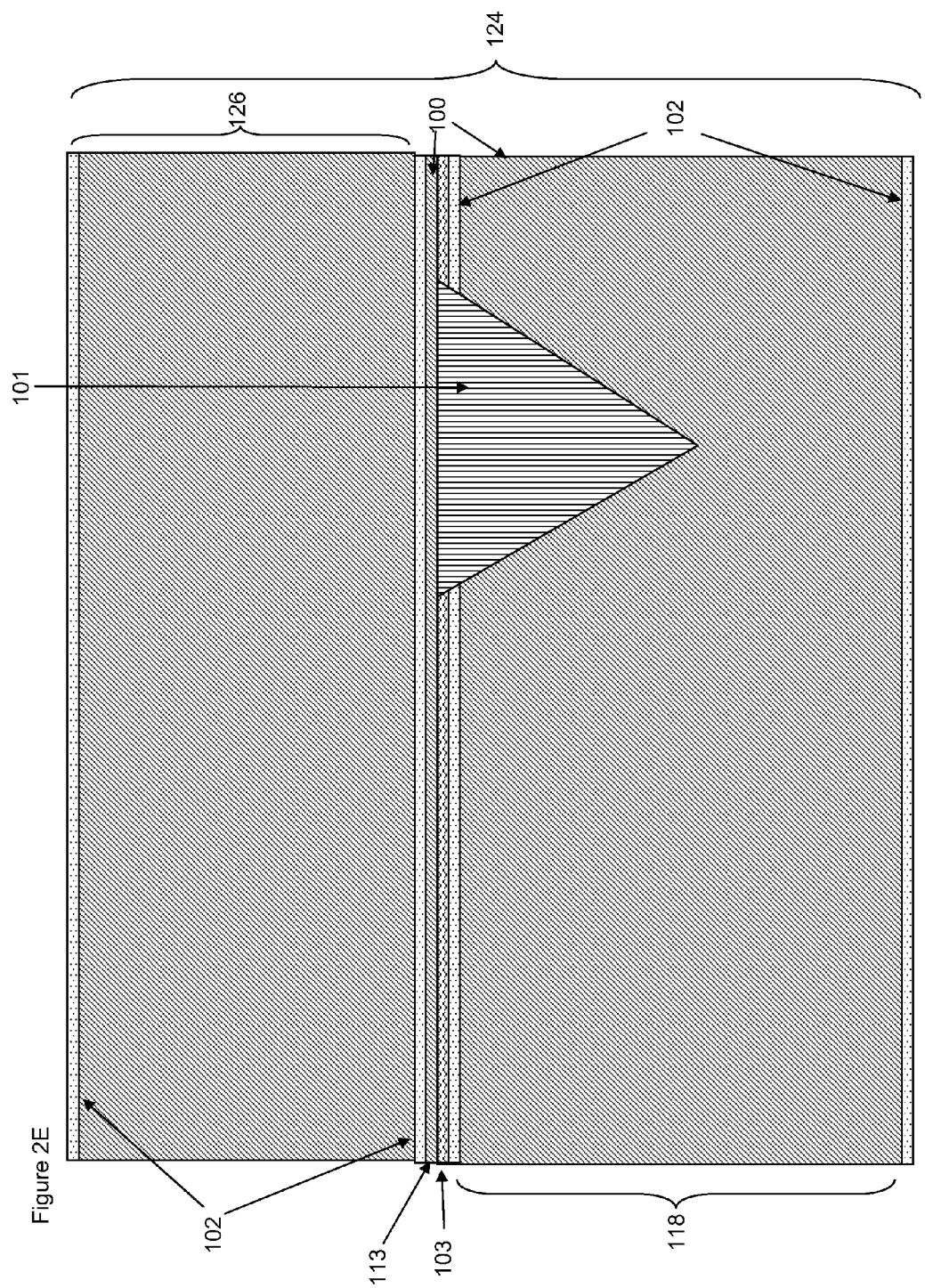
FIG. 2E is a side cross section view of a fifth step in a process for lithographically creating a beam device according to an embodiment of the present invention.

As shown in FIG. 2E, the handle (122) is removed by wet or dry etching.

Figure 2F:
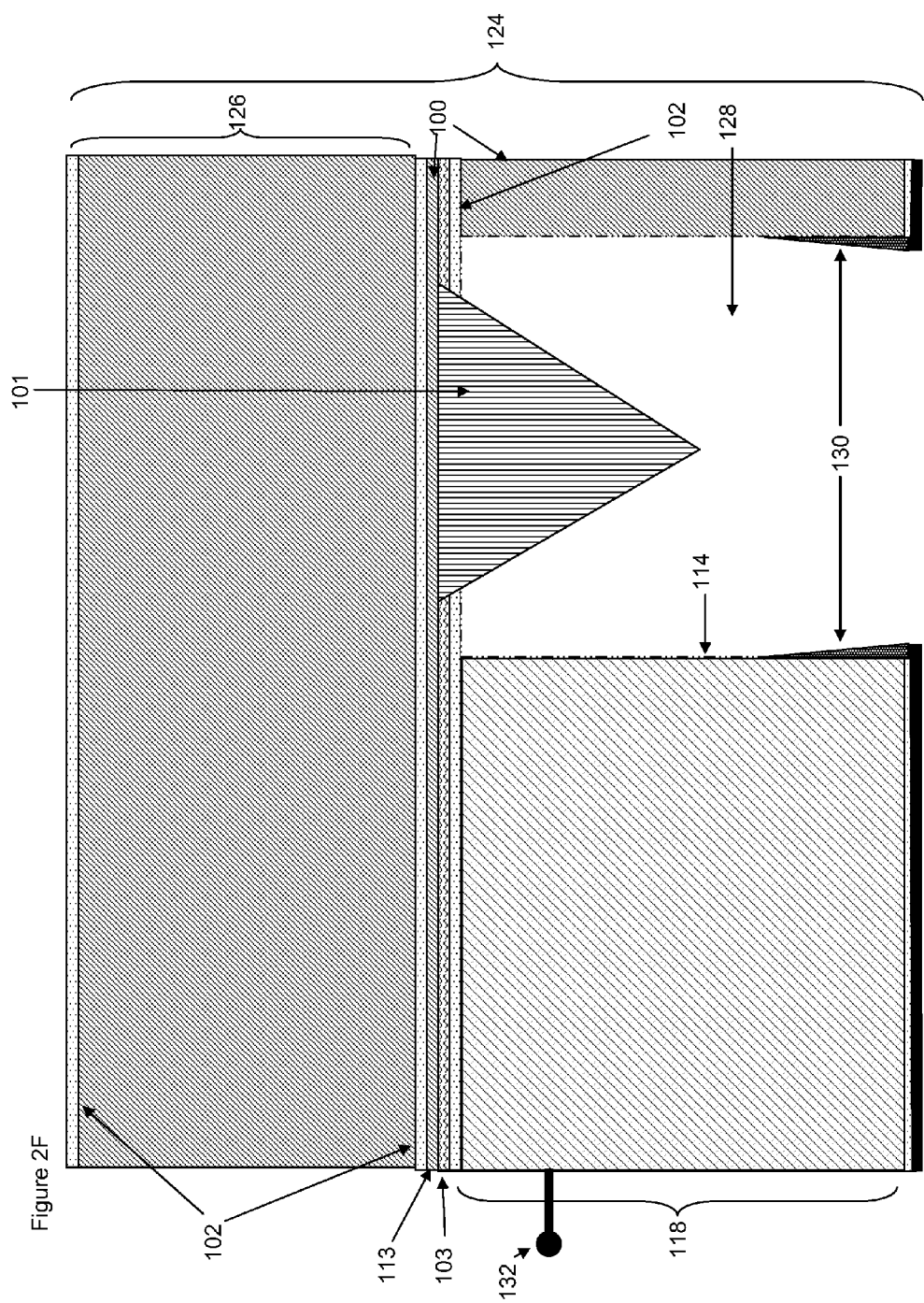
FIG. 2F is a side cross section view of a sixth step in a process for lithographically creating a beam device according to an embodiment of the present invention.

As shown in FIG. 2F, the cathode chamber 128 and the fluid passage 114 are dry etched into layer 118. A metal bond coating (109) is patterned onto the bottom surfaces 102. A metal coating of chromium with an over coat of titanium (130) is partial coated on the inside surface of the cavity 128. This in conjunction with current through connection 132 and the bulk silicon 118 causes heating of the titanium to release any oxygen it may have absorbed and readies it to capture any remnant oxygen in the cavity after it is filled with argon. A small percentage of hydrogen in the argon feed gas will also help remove oxygen from the chamber. Any oxygen will quickly destroy the cathode and must be prevented.

Figure 2G:
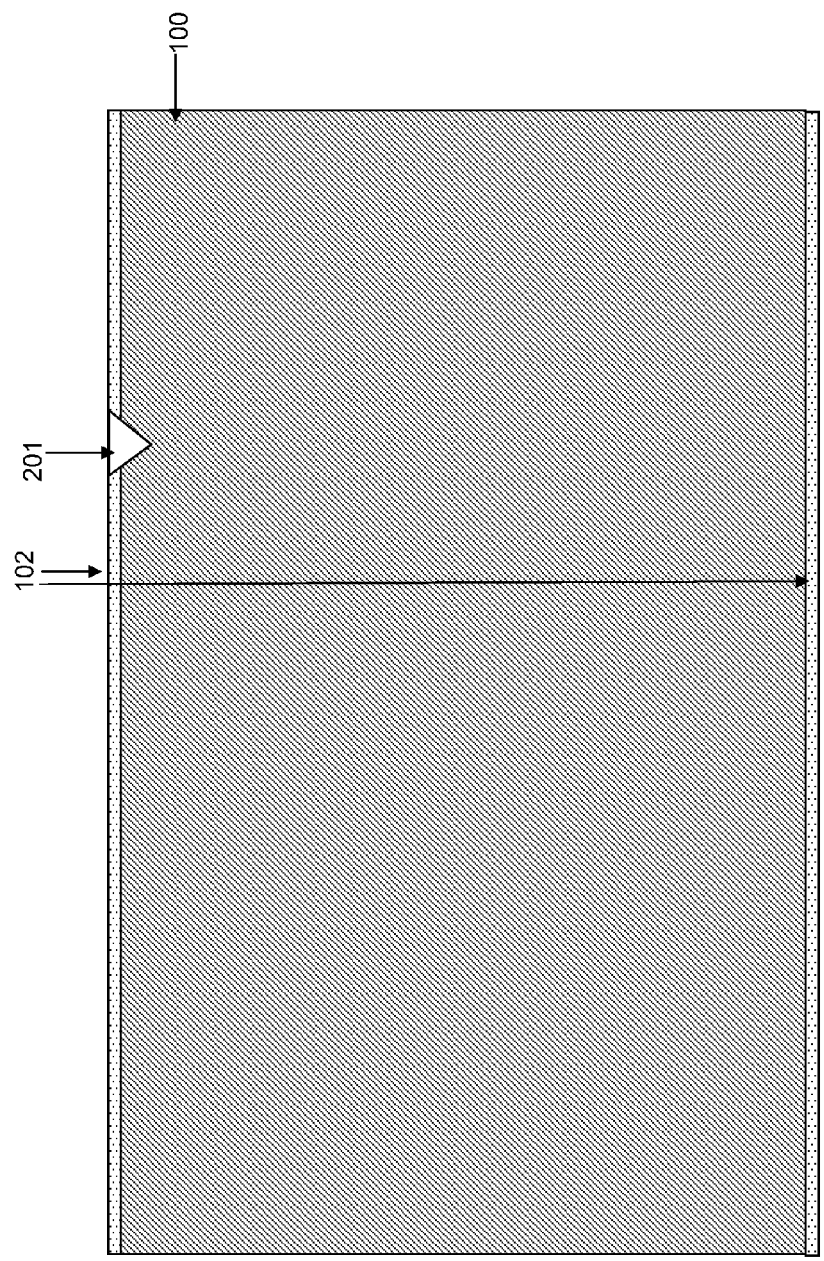
FIG. 2G is a side cross section view of a seventh step in a process for lithographically creating a beam device according to an embodiment of the present invention.

As shown in FIG. 2G, a single sided 100 oriented wafer (100) with a silicon oxide coating (102) is patterned with a square exposed silicon area (1 to 10 microns) and wet etched to limit.

Figure 2H:
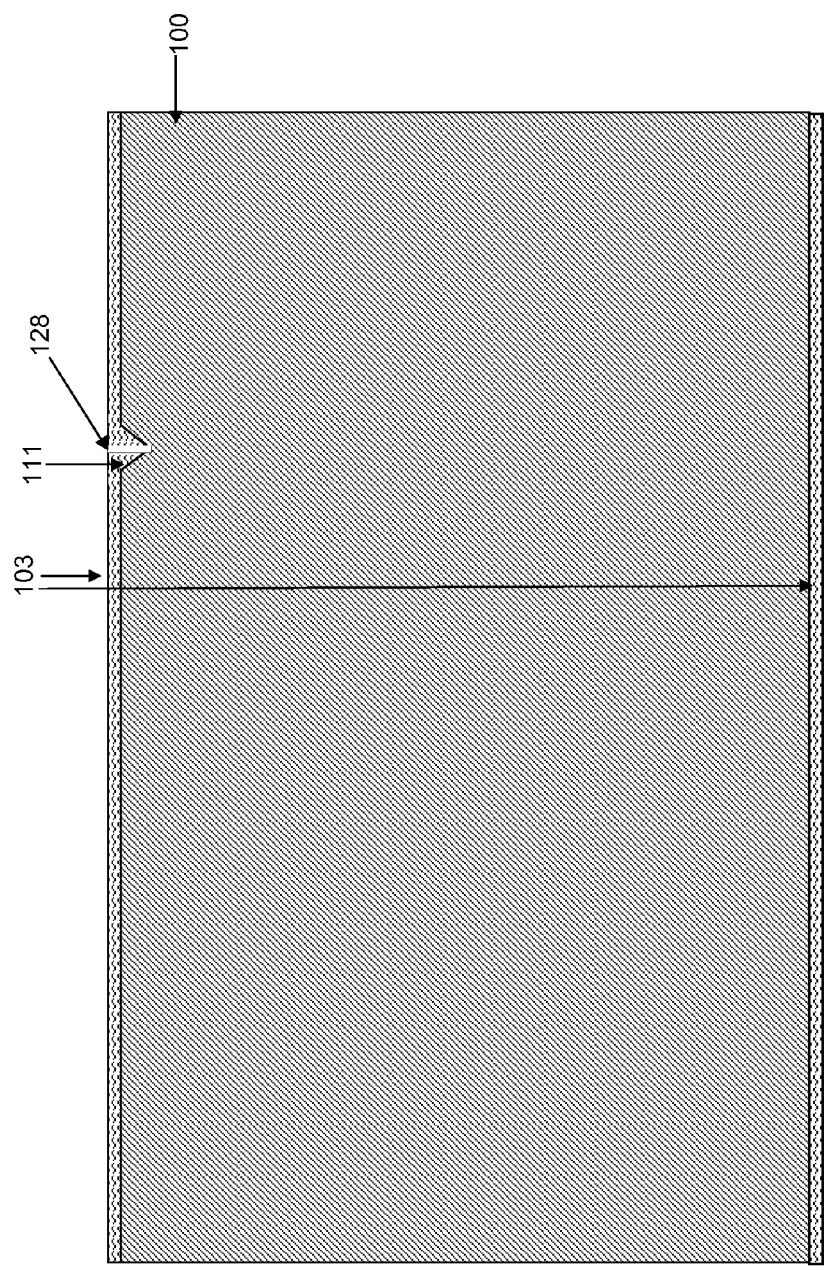
FIG. 2H is a side cross section view of an eighth step in a process for lithographically creating a beam device according to an embodiment of the present invention.

As shown in FIG. 2H, the wafer of FIG. 2F is stripped of oxide and coated with silicon nitride forming tip 111 and a hole 128 is placed at the apex of tip.

Figure 2I:
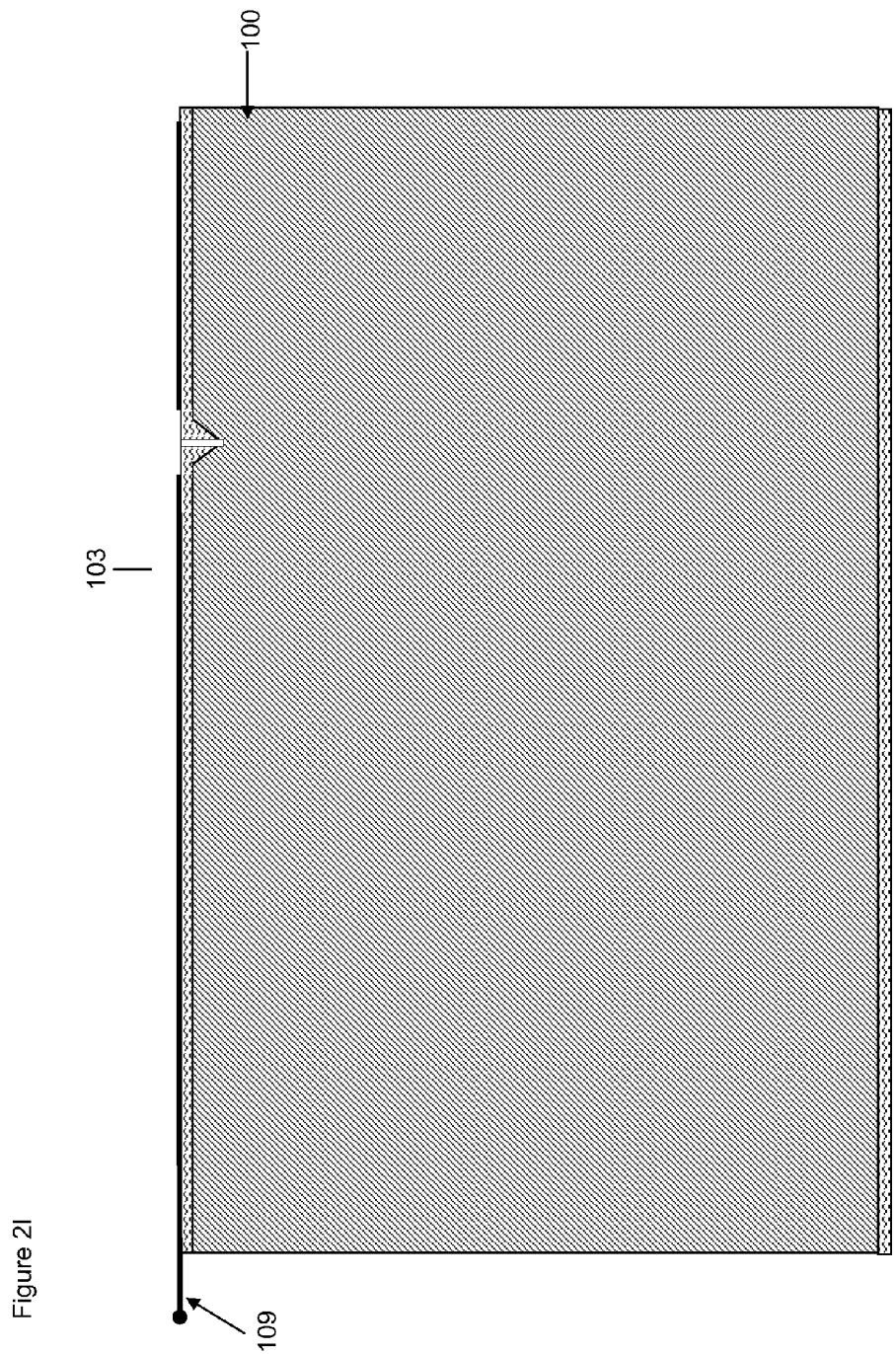
FIG. 2I is a side cross section view of a ninth step in a process for lithographically creating a beam device according to an embodiment of the present invention.

As shown in FIG. 2I, a metal layer (109) is patterned on the top of the wafer of 2H.

Figure 2J:
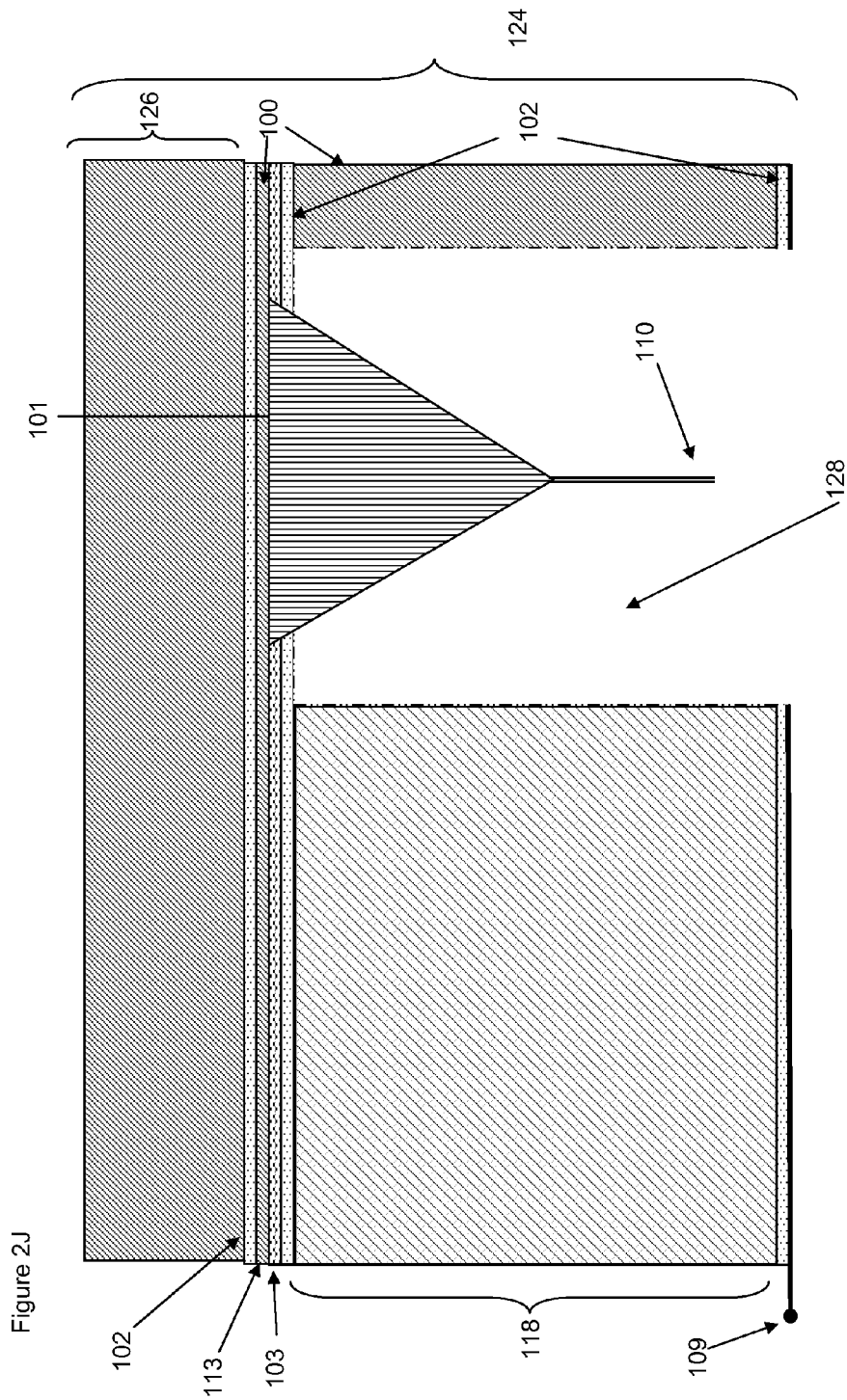
FIG. 2J is a side cross section view of a tenth step in a process for lithographically creating a beam device according to an embodiment of the present invention.

As shown in FIG. 2J, a metal layer (109) is patterned onto the bottom of 118.

Figure 2K:
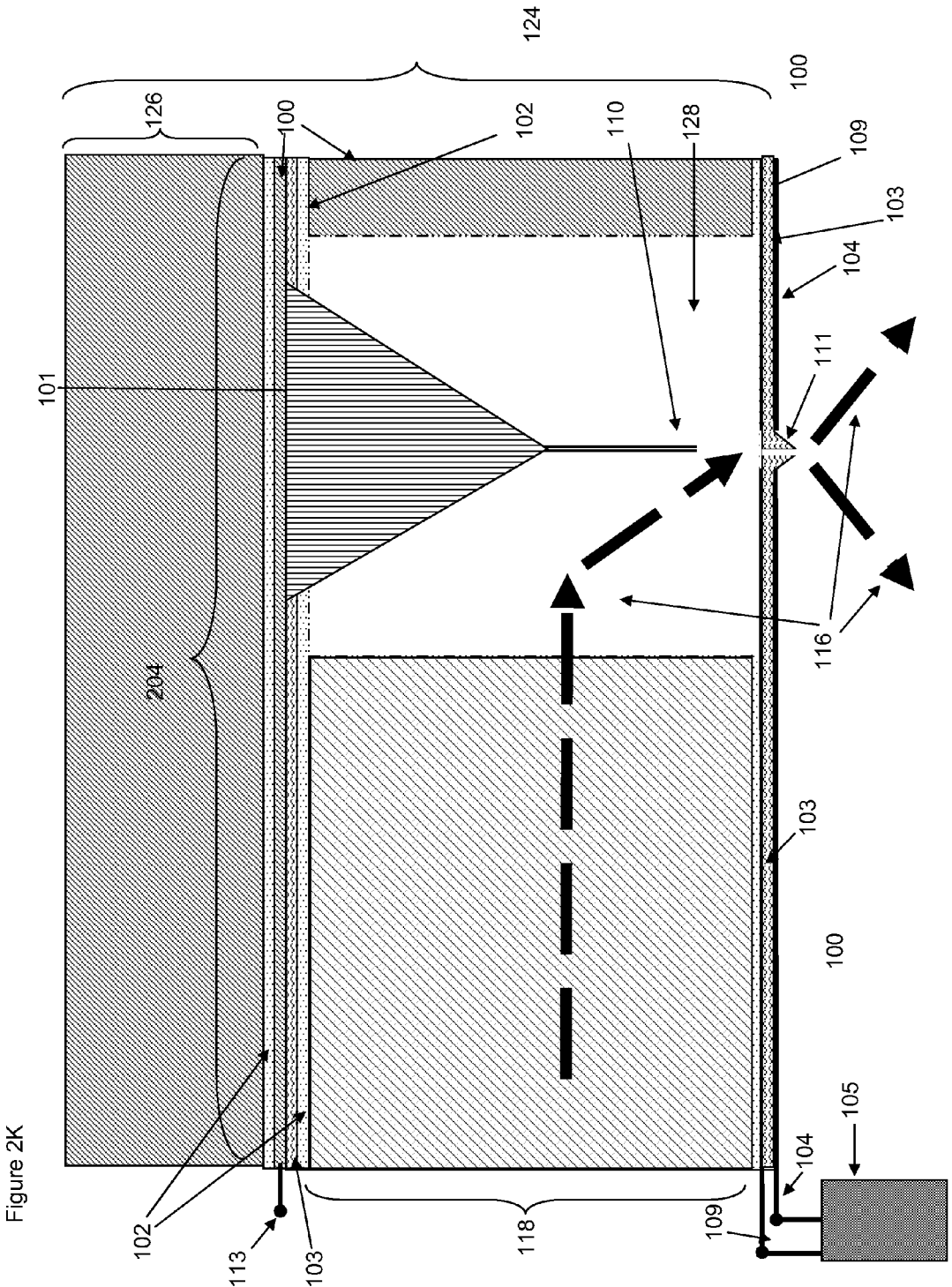
FIG. 2K is a side cross section view of an eleventh step in a process for lithographically creating a beam device according to an embodiment of the present invention.

As shown in FIG. 2K, the wafer of FIGS. 2I and 2J are bonded together, the silicon of wafer 21 is etched away and a collector pattern (104) is patterned onto the insulator 103 now forming the bottom of nearly completed wafer 2K.

Figure 2L:
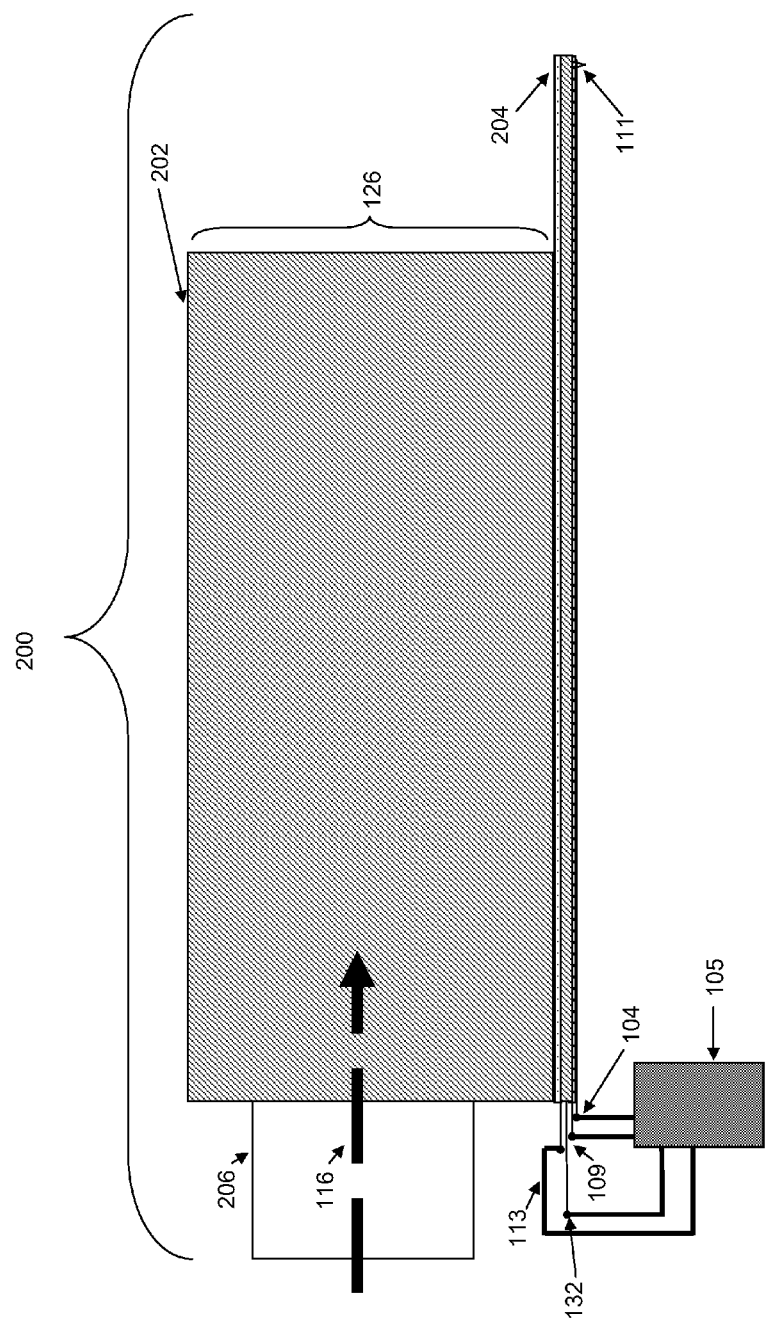
FIG. 2L is a side cross section view of the completed device according to an embodiment of the present invention.

As shown in FIG. 2L, the tip assembly (200) body 126 is etched back over the cantilever 204 (including elements below the body or handle layer 126) and connections are made to controller 105 to leave a fully functional device.

Figure 2M:
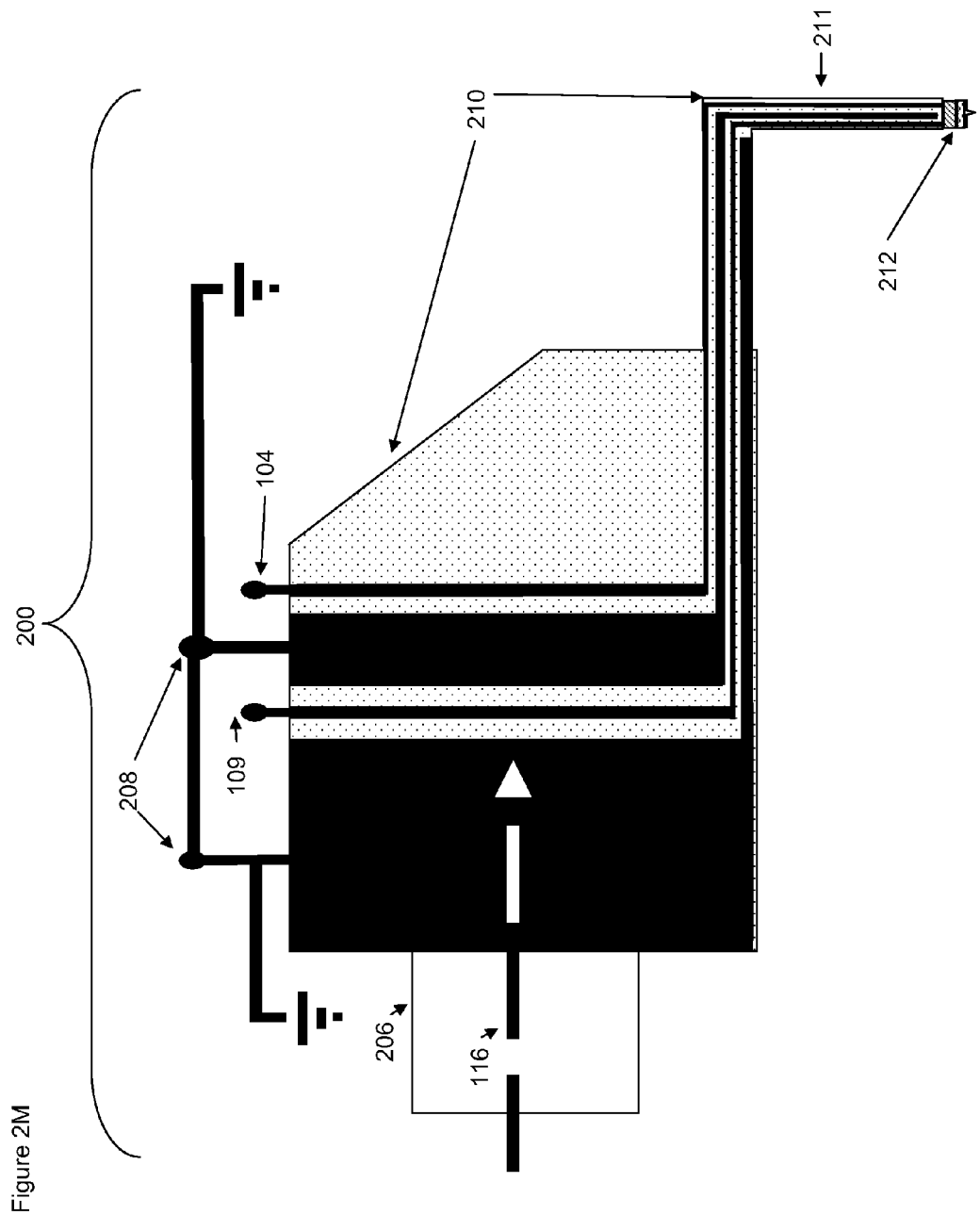
FIG. 2M is a side plan view of a representative embodiment of a class of SPM tip assemblies with fluid delivery capability incorporating the beam device in the extended tip shaft.

FIG. 2M shows an embodiment and complete tip assembly in which the tip shaft 211 and body and cantilever 210 are made from 110 oriented silicon patterned to create the tip assembly without the final tip beam component 212 (integrated into the cantilever beam end in the earlier figures). Wet etched surfaces on the cantilever top and bottom leave an atomically smooth vertical wall which becomes the top and bottom of the cantilever when completed (see, e.g., Provisional application No. 60/679,926 referenced below). Channel 114 on the back of the tip body 210 connects to the coupling through hole (dashed lines in FIG. 2N) to the beam device chamber 128. Connections 109, 104 of a ground plane 208 and the high voltage line 113 (not shown on the back side of tip body, shaft and cantilever 210) are bonded to beam device 212. A typical width and depth for beam device and tip shaft is 35 microns square. Shafts (211) and devices as small as 1 micron square at the tip end (212) and shaft lengths as long a 25 millimeters from the top of the cantilever are possible.

Figure 2N:
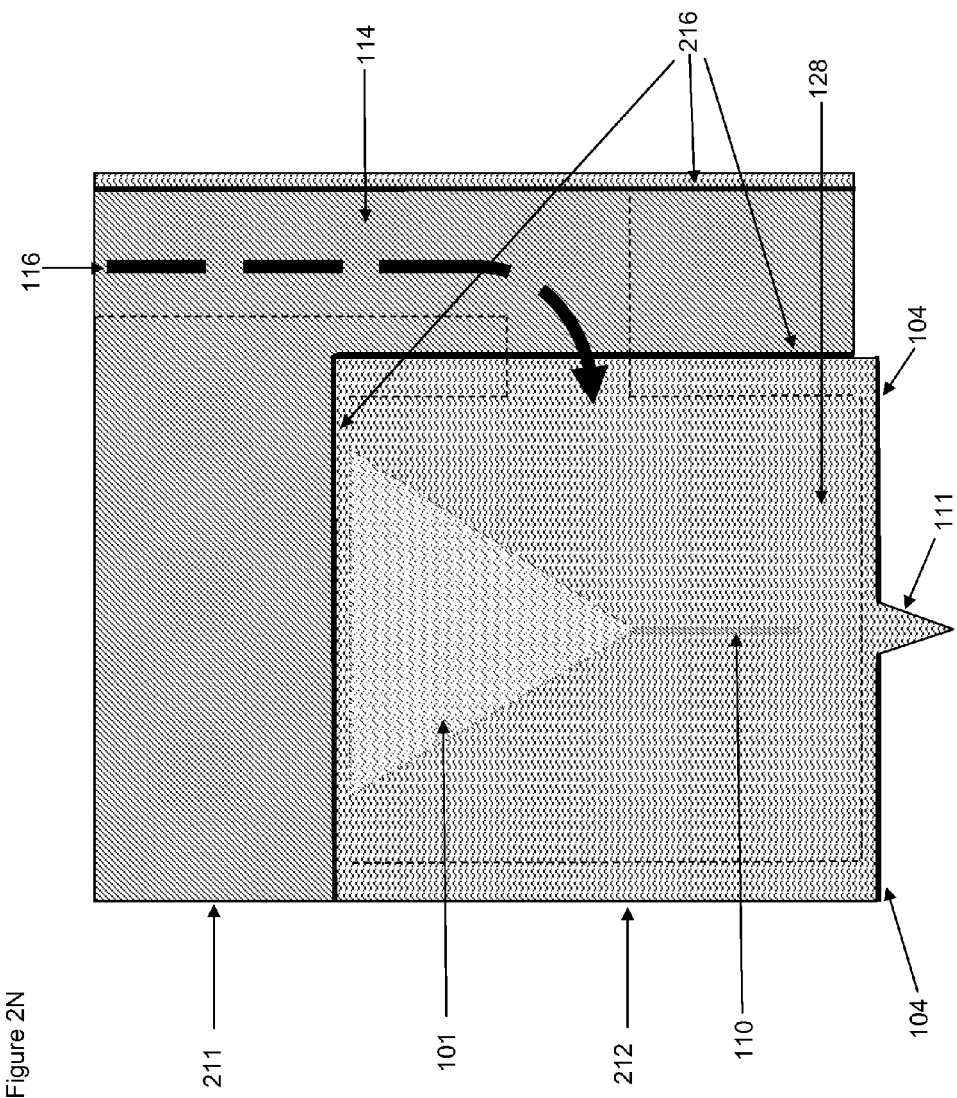
FIG. 2N shows an end on plan view of a beam device and integrated AFM tip incorporated and bonded to the extended tip shaft showing in dashed lines certain interior features and fluid delivery means.

FIG. 2N shows a side plan view of the tip shaft (211) bonded to the beam device (212) with dashed or grey shapes indicating some of the structures (101, 110, 128, 114, fluid flow 116 and passage 114) within the beam device (212). This embodiment has a beam device essential in all respects to that of FIG. 2K without body element 126.

Figure 2O:
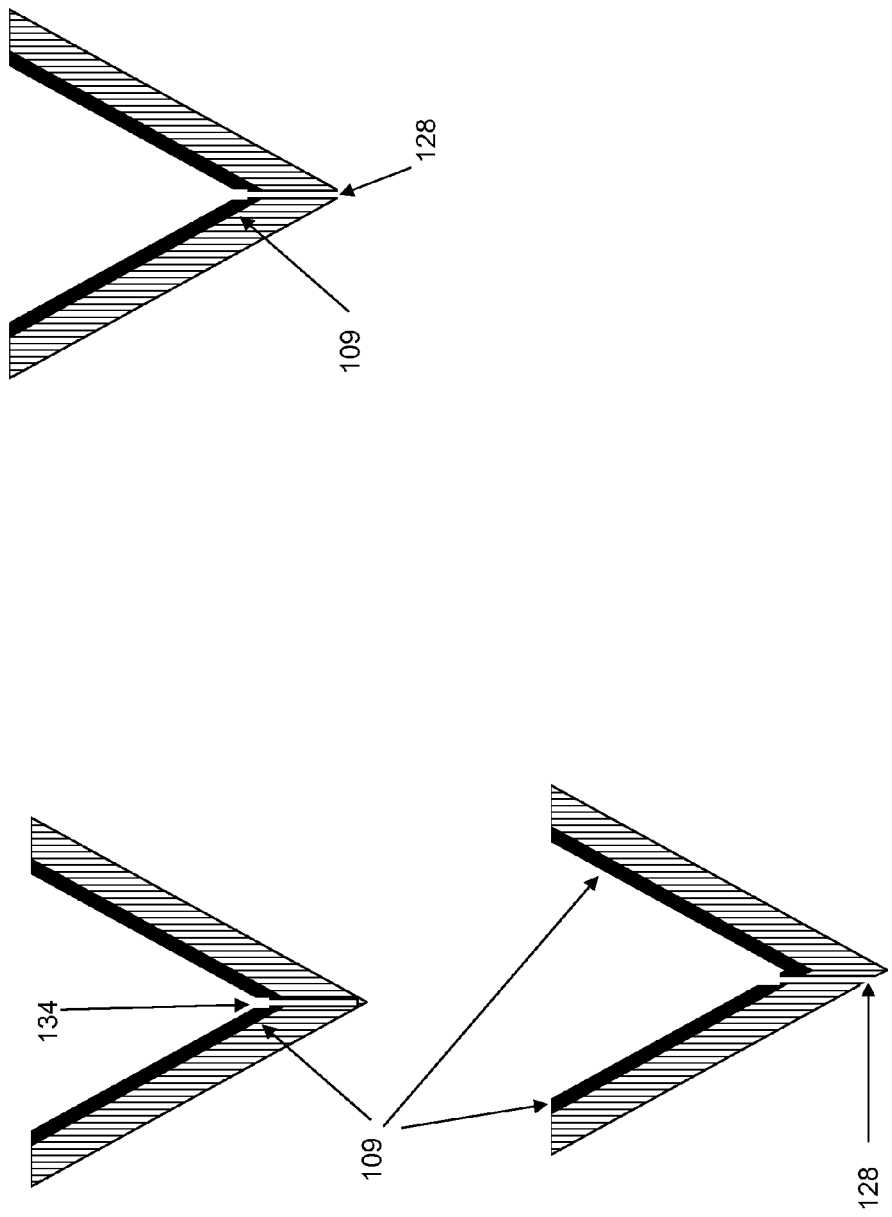
FIG. 2O shows three side cross sections of steps to create a coaxial tip with a window, with an offset beam channel and with a coaxial channel.

FIG. 2O shows three views of SPM tip ends 111 made of diamond like carbon, and/or amorphous diamond, and/or polycrystalline diamond and/or nanocrystalline diamond with a layer 109 of high-Z metal such as Ti/Ag/Au, or Cr/Ag, Au, or Ti/Ni/Cu, Ti/Au, or Cr/Au or other suitable bond and high-Z material as is well known in the art. In a variation of process 2H the metal bond and acceleration and/or beam steering electrode 109 is removed in an area above the channel to near 134 or through the tip 111 be formed by wet and/or dry etching, and/or ion milling. After the carbon material is exposed an electron beam heats the carbon in the presence of oxygen etching a very narrow channel to the bottom of the tip but not through the tip 111 leaving a strong, vacuum capable electron beam window and surrounding carbon and high-Z metal walls which serve to collimate the beam and allow only parallel streams of electrons through the window. Using the formula from [1] we obtain with a carbon window of some 100 nanometers or less a electron energy less then 250 volts and as little as 25 volts with a sealed vacuum microstructured source. Alternately the channel which may be coaxial or slightly off axis is continued through the tip 111 to permit the fluid as described above to escape and displace oxygen from the interior of the beam assembly. Since manufacturing errors will produce channels that are offset or in which the window above is over machined to extinction offset like winnowed parts offer the important advantage of retaining a very sharp tip for SPM imaging (in fact a channel offset just past the lowest point (short of the line representing the exact center of the tip) of the tip 111 produces a sharper tip by lowering the effective tip radius by almost half.

Figure 3A:
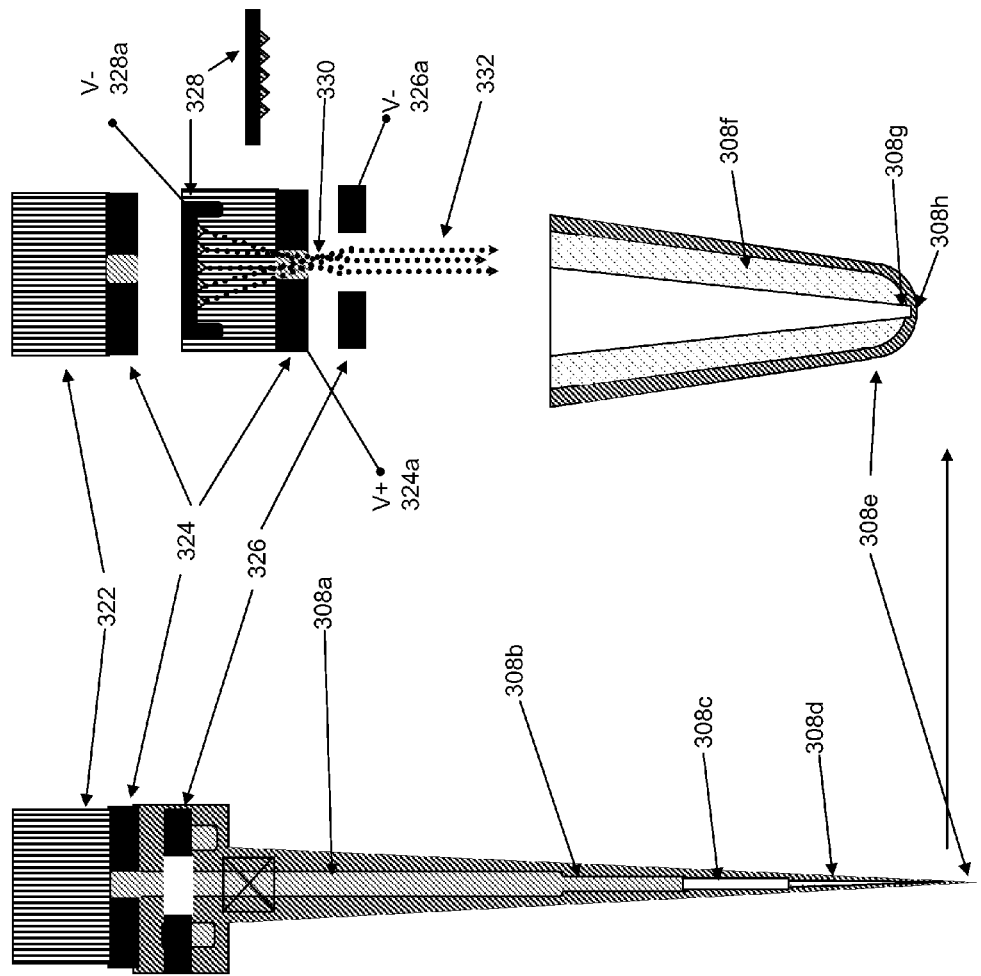
FIG. 3A shows a cross sectional view of an electron beam column, source and tip.

FIG. 3A shows a cross section view of fully sealed hard vacuum encapsulating long tip shaft assembly, plus detailed cross section views of the electron source or gun and cold cathode arrays of emitters such as boron doped diamond or tungsten. The details of the very tip of the tip shaft are also enlarged and shown in cross section.

Figure 3B:
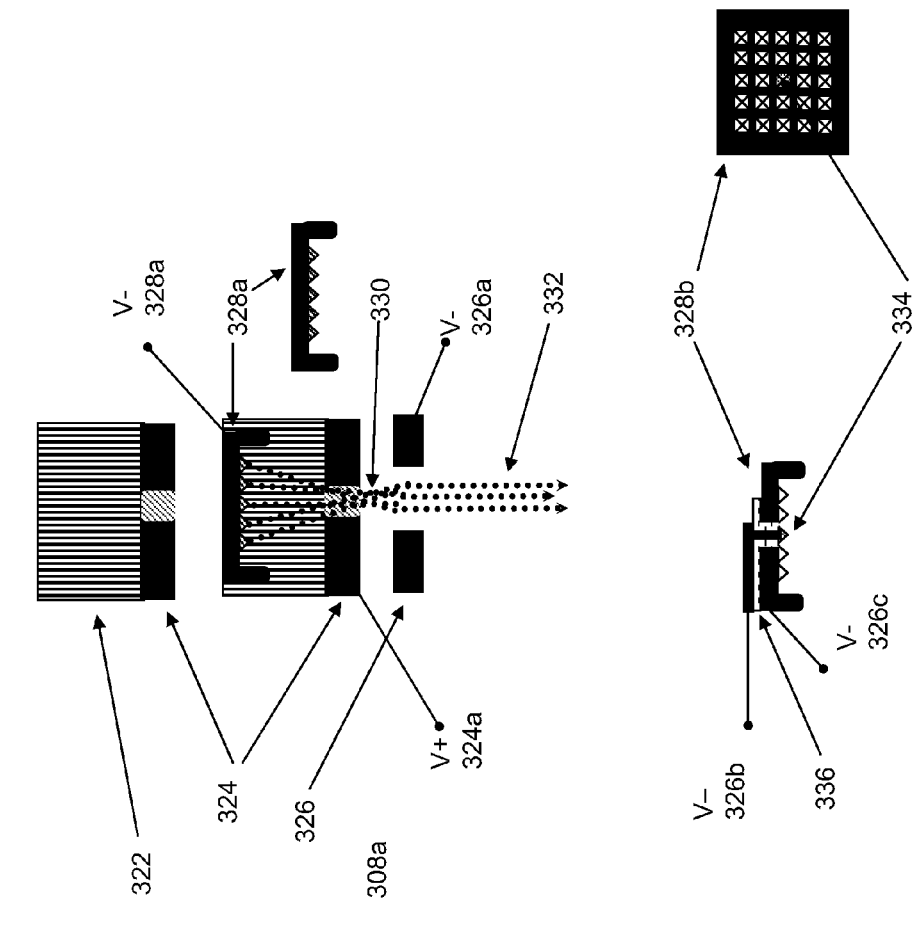
FIG. 3B shows a cross sectional and top view of a source or electron gun with its cold cathode emitters.

FIG. 3B shows further details in cross section of the electron source or gun including a means for selectively confining emissions to one or more electron cold cathode emitters or increasing current by using many electron emitters. The electron emitter array is also shown as a top or face on view.

Figure 3C:
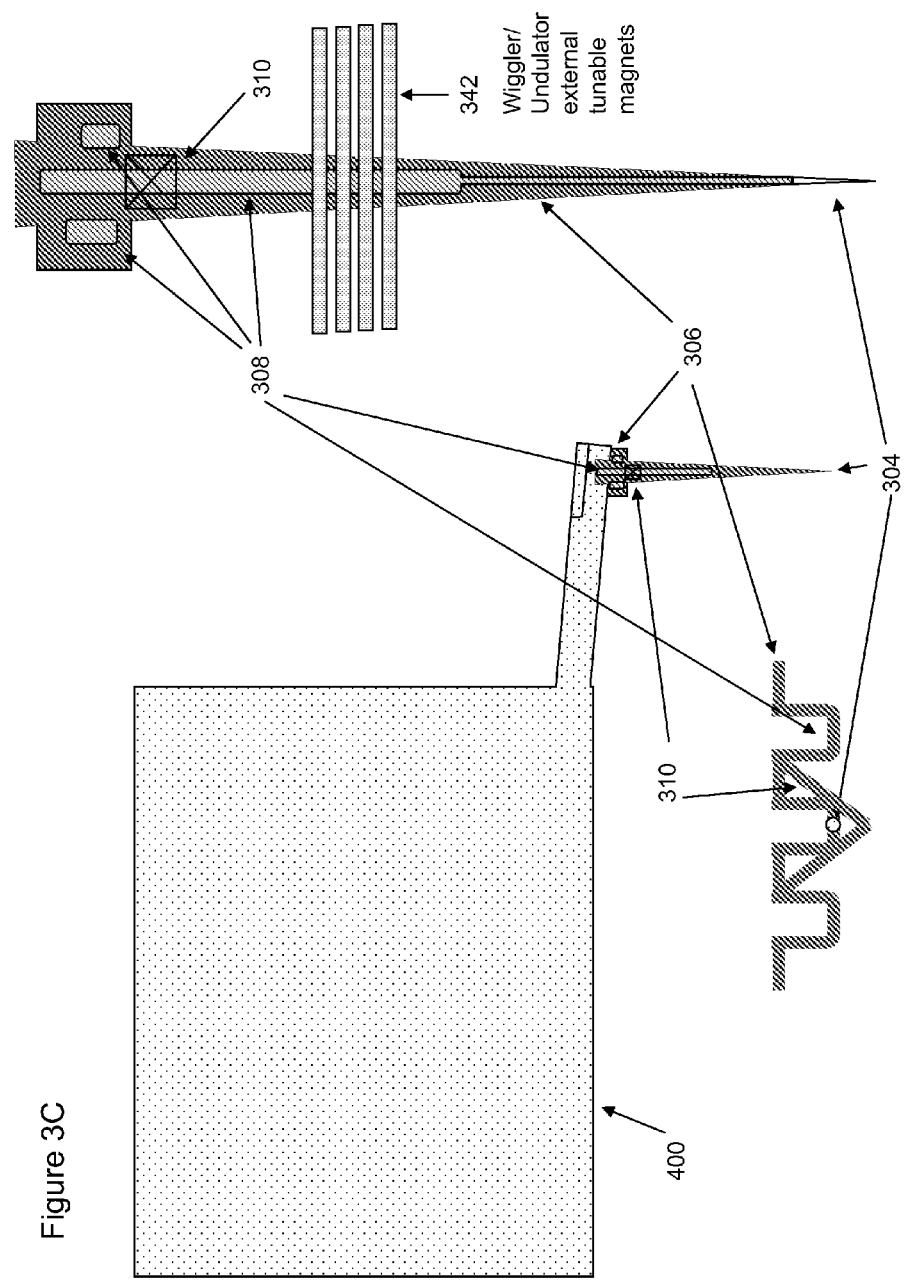
FIG. 3C shows a cross section of the evacuated tip shaft integrated with a cantilever and magnetic plates to form a free-electron laser (FEL).

FIG. 3C shows a cross section of the evacuated tip shaft integrated with a cantilever. This drawing also shows three magnet plates used to create an undulator which in conjunction with the electron beam proceeding down the tip shaft makes a FEL (free electron laser) to produce electromagnetic waves at almost any desired frequency.

Figure 3D:
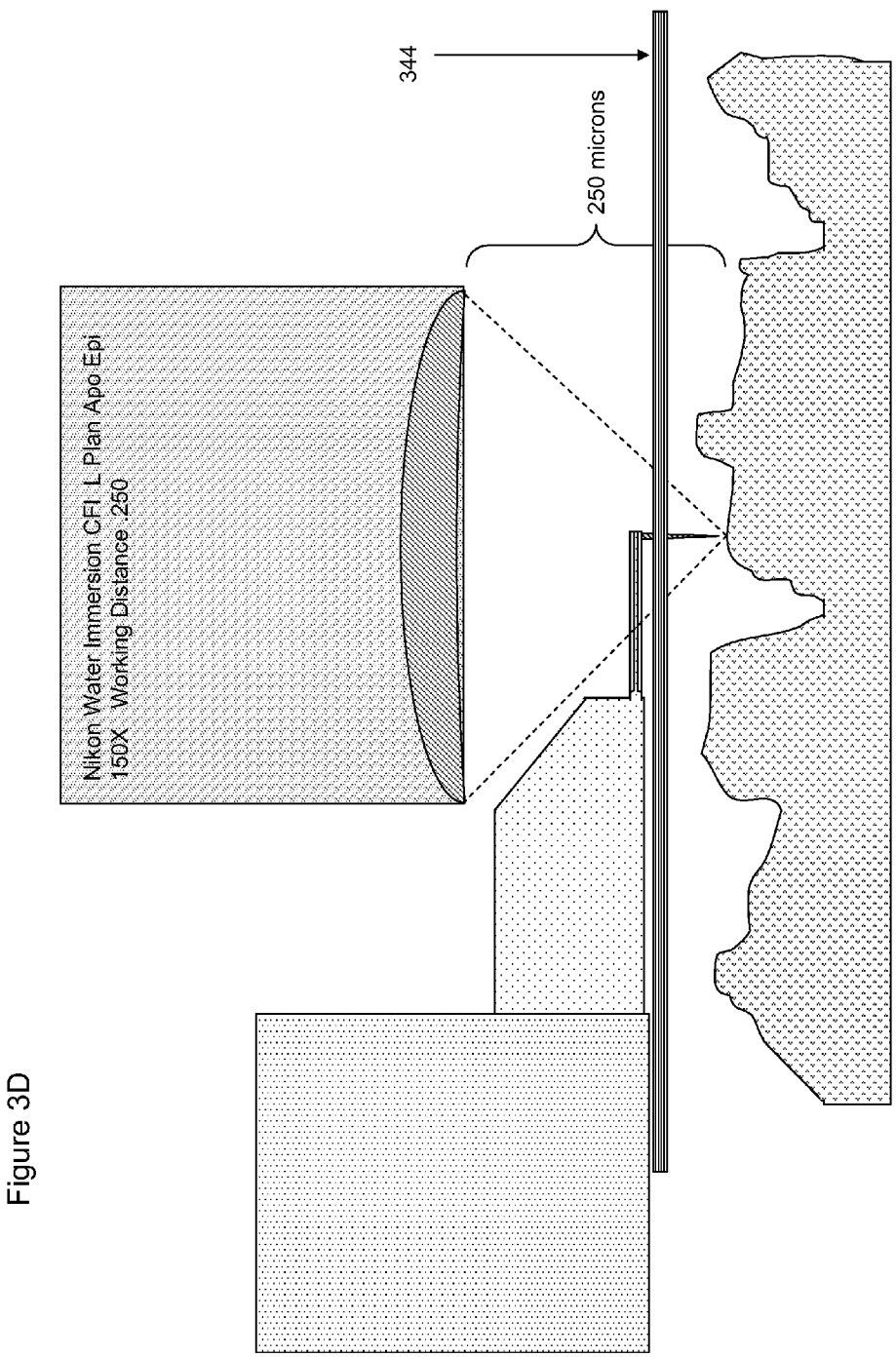
FIG. 3D shows a cross section view of operational components of an integrated confocal/SPM/ebeam system with FEL and intrinsic diamond x-ray detector cum magnetic undulator assembly.

FIG. 3D shows a cross section view of operational components of an integrated confocal/SPM/ebeam system with FEL and intrinsic diamond x-ray detector (344) cum magnetic undulator assembly.

Figure 3E:
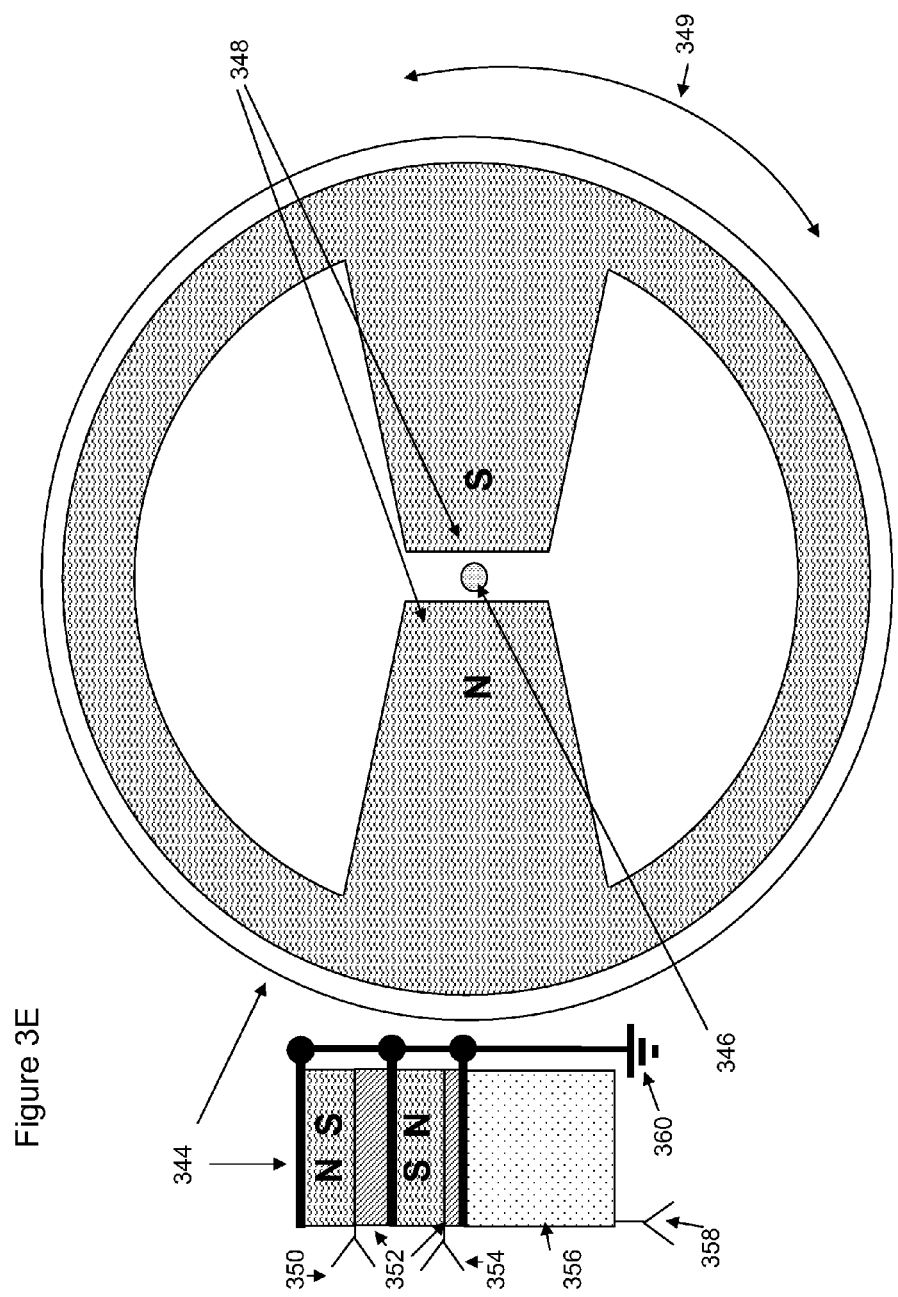
FIG. 3E is a cross section and face or top view of a magnetic undulator, piezoelectric undulator adjustment, and intrinsic diamond uv/x-ray detector which can serve as a substrate for the tunable magnetics.

FIG. 3E is a cross section and face or top view of the magnetic undulator, piezoelectric undulator adjustment, and intrinsic diamond uv/x-ray detector 356 which serves as a substrate for the tunable magnetics.

FIG. 3F is top view of a magnetic pole arrangement which induces elliptical polarization in the EM waves created by the FEL.

As noted above, a long channel can be created in high-Z material by imprinting, etching or ion or e-beam machining or other processes known in the art.

In operation the electron gun or source 322 passes a current of energetic electrons down the tip shaft which is typically 20 to 40 microns wide at its top with the shaft itself being 40 to 60 microns wide for most of its length thus passing through the plate with magnetic stack 344 with its matching hole 346 only 1 to 2 microns larger then the tip shaft. As electrons undulate between the magnetic poles, electromagnetic waves are coherently emitted in a forward tight beam plane polarized and aligned with respect to the undulator magnetic poles 348. Thus this assembly forms a micro-scale or nano-scale Free Electron Laser (FEL). By making the end of the tip shaft a thick solid diamond structure only the EM radiation will escape, or alternatively by thinning the tip shaft end and making a narrow passage only a few nanometers wide, a precise electron beam only a few nanometers wide can be obtained; and by using the SPM qualities of the system to space the tip end only a few angstroms from the sample surface, this electron beam will operate in the near field thus forming a Scanning Near field Electron Microscope or SNEM™ (trademark of Metadigm LLC, assignee of the present application). The detector for the SNEM™ is the conductive sheath of diamond or other conductive material electrically isolated at the tip and connected to a sensitive electrometer (not shown but as is well know in the art). In the near field the close proximity of the tip end to the sample means that most if not all collectable secondaries will be collected within femtoseconds of emission a few angstroms from the emission area. This latter technique may be made to operate with voltages as low as tenths of an electron volt with suitably thin tip end windows 308$h$ of a few angstroms of diamond over a one or two nanometer aperture diameter. Note that rotation of the uv/x-ray detector by rotating means 349 or 320 permits the plane rotation of the EM waves or a change in the circular to elliptical rotation plane depending on the magnetic pole design 318$a$ and 318$b$. As is well understood the magnetic material forming the undulator may be incorporated into the tip shaft or on to one or more substrates which may be intrinsic diamond or not, may be rotatable or not and which be any suitable magnetic material including samarium cobalt, iron neodymium or other appropriate magnetic material.

The electron gun and tip shaft assembly shown in FIG. 3A includes the source assembly 322 which may be a separate MEMS construction attached after construction to cantilever and tip shaft or built in place on said cantilever and/or shaft by MEMS techniques. In operation electron emitter plate 328 (shown with an array of 25 boron or nitrogen doped diamond pyramidal emitters such as the center emitter 334) with voltage 328$a$ has emitters which as a group and/or individually are given a negative charge with respect to the electrode 324 and its voltage 324$a$, note that the plate 328 has a cup structure with rounded smooth ends which project below the emitters and serve to focus the emitted electrons toward the center of the gun. After passing through the aperture in 324 the diverging electrons are focused by electrostatic lens 326 (with voltage 326$a$) to a collimated beam which may then be used to probe a sample or passed through the undulator to produce electromagnetic emissions or both of the latter uses. FIG. 3B shows a further embodiment in which the center emitter 334 is electrically separated by insulator 336 from the other emitters and used alone or with those emitters at the same or different voltage 326$b$ to create a particular energy of emitted electrons. Further other emitters may be similarly electrically separated and individually controlled. The central emitter 334 will produce a single finely focusable electron beam in which in conjunction with the emission tip shaft window 308$h$ may provide a controllable and precise energy source for interactions and modifications of sensitive materials such a biological molecules and other sensitive chemical constructs.

The emitters when emitting as a group can provide substantially more beam current useful in both the FEL mode with the undulator and as a direct beam ebeam source. As shown with 25 emitters the total current is nearly 25 times the individual emitter current. The MEMS techniques used to produce the emitters suggests that 100 to 2500 or more emitters may be possible in this configuration without substantially increasing the size of the source assembly.

Some diffusion of gases (particularly hydrogen, and helium) can be expected to enter the hard vacuum formed in the tip shaft assembly which at some point would render the device dysfunctional. To prevent this the tip shaft can be stored in a vacuum and operated in an environment of some gas which has a very low probability of diffusion into the tip shaft chamber, such as nitrogen, carbon dioxide, argon or xenon or other suitably low diffusion gas when used with a metal, sapphire, or diamond tip window 308$h$.

Further aspects of the FEL embodiment depicted in FIGS. 3A-3F are described in above-referenced Provisional Application No. 60/711,899.

The Electron gun (cathode/anode) may also be designed using methods well known in the MEMS art and to MEMS practitioners, e.g., according to any of the teachings for macro guns embodied in [2], [3], or [4].

Although the invention has been described in terms of the illustrative embodiments, it will be appreciated by those skilled in the art that various changes and modifications may be made to the illustrative embodiments without departing from the spirit or scope of the invention.

Therefore, the above description should not be taken as limiting the scope of the invention as defined by the claims.

REFERENCES

The following U.S. patents and applications by the inventor of the present application are incorporated by reference in this application for all purposes:

U.S. patent application Ser. No. 11/067,517, filed Feb. 25, 2005, entitled "Diamond Capsules and Methods of Manufacture";
U.S. Pat. No. 6,865,927;
U.S. Pat. No. 6,507,553;
U.S. Pat. No. 6,353,219;
U.S. Pat. No. 6,339,217;
U.S. Pat. No. 6,337,479;
U.S. Pat. No. 6,265,711;
U.S. Pat. No. 6,252,226;
U.S. Pat. No. 6,242,734;
U.S. Pat. No. 6,232,597;
U.S. Pat. No. 5,756,997;
U.S. Pat. No. 5,751,683;
U.S. Pat. No. 5,377,552;
U.S. Pat. No. 5,239,297;
U.S. Pat. No. 4,935,728;
U.S. Pat. No. 4,806,776;
U.S. Pat. No. 4,782,327;
U.S. Pat. No. 4,604,648;
U.S. Pat. No. 4,589,030;
U.S. Pat. No. 4,561,731;
U.S. Pat. No. 4,435,616; and
U.S. Pat. No. 4,403,834.

In addition, the following documents referenced above by number are incorporated herein by reference for all purposes.

[1] T. Doll et al., "Low-energy electron beam focusing in self-organized porous alumina vacuum windows," *Applied Physics Letters* 76:24, pp. 3635-3637 (2000).
[2] Munro's Electron Beam Software Ltd., SOURCE Graphics output for FE gun and for Pierce gun, URL references www.mebs.co.uk/fegun.htm and www.mebs.co.uk/pierce.htm.
[3] V. P. Yakovlev et al., "100 MW electron gun for a 34.3 GHz magnicon," Proc. 2001 Particle Accelerator Conference, Chicago, at URL reference epaper.kek.jp/p01/PAPERS/MPPH115.PDF.
[4] J. Ziegler, "Particle Interactions with Matter," at URL reference www.srim.org.
[5] J. R. M. Vaughan, "Synthesis of a hollow-beam pierce gun," IEEE Trans. Electron Devices, vol. ED-34, February 1987 (Abstract), at URL reference adsabs.harvard.edu/cgi-bin/nph-bib_query?bibcode=19871TED . . . 34.468V&db_key=INST.
[6] F. Niell, "Electron Gun Beam Extraction with MOSFETs," Proc. 1999 Particle Accelerator Conference, New York, at URL reference accelconf.web.cern.ch/AccelConf/p99/PAPERS/MOP143.PDF.
[7] CPO Ltd., Charged Particle Optics Programs—"The 'benchmark test' files," at URL reference www.electronoptics.com/benchmar.htm.
[8] J. R. Pierce, "My Work with Vacuum Tubes at Bell Laboratories," reprinted from SMEC (now SMECC) "Vintage Electrics," 3:1 (1991), at URL reference www.smecc.org/john_r_pierce_electron_tubes.htm.
[9] Tel Aviv University, "The Principle of Electrostatic Accelerator (EA) FEL Operation," at URL reference www.eng.tau.ac.il/research/FEL/0a.html.
[10] Chang Liu, Assistant Professor (bio), University of Illinois at Urbana-Champaign.

What is claimed is:

1. A scanning probe microscopy (SPM) device comprising:
a body having a cavity region extending between an upper surface and a lower surface formed in a semiconductor device;
a tip extending downward below at least a portion of the lower surface, the tip having an axis;
a first electrode disposed near at least a portion of the lower surface, the first electrode being formed with an aperture; and
a second electrode disposed within the cavity region wherein:
the second electrode is configured to emit a charged-particle beam directed toward the first electrode;
the charged-particle beam travels along a particular direction that is perpendicular to the upper and lower surfaces, and
the charged-particle beam passes through the first electrode's aperture.

2. The SPM device of claim 1 wherein the tip is formed integrally with at least a portion of the body.

3. The SPM device of claim 1 wherein the tip has an aperture therethrough and wherein the second electrode is arranged relative to the tip such that the charged-particle beam passes through the aperture of the tip.

4. The SPM device of claim 1 wherein:
the axis of the tip passes through the lower surface's aperture; and
the second electrode is arranged relative to the lower surface's aperture such that the charged particle beam passes through the lower surface's aperture.

5. The SPM device of claim 1 further comprising a titanium getter or oxygen absorber to protect the device from oxygen contamination.

6. The SPM device of claim 1 wherein the charged particle beam is an electron beam.

7. The SPM device of claim 1 wherein the charged particle beam is an ion beam.

8. The SPM device of claim 1 wherein the charged particle beam is usable to cause a chemical or thermal reaction which adds or subtracts material from an object.

9. The SPM device of claim 1 wherein a portion of the top surface above the second electrode comprises an insulating material that becomes conductive in response to an ultraviolet or x-ray pulse to conduct a current pulse to a beam emitter region of the second electrode.

10. The SPM device of claim 1 wherein the device is created using at least one of the following processing steps:
etching a pit in a first wafer;
growing one or more materials in the pit to form the second electrode;
applying a coating layer over the top of the second electrode;
bonding a second wafer to the first wafer;
removing a bottom layer of the first wafer;
etching away the first wafer material around the second electrode to form a cathode chamber and fluid passage;
applying a metal coating to an inside surface of the cathode chamber;
forming a tip assembly; or
bonding the tip assembly to an open face of the cathode chamber.

11. The SPM device of claim 1 wherein the first electrode comprises a Pierce angle aperture and a side wall.

12. The SPM device of claim 1 further comprising one or more accelerating and focusing electrodes disposed near the path of the charged particle beam for increasing the particle energy per unit area at a target or object.

13. The SPM device of claim 1 wherein the second electrode comprises one or more cold cathode emitters to produce source electrons.

14. The SPM device of claim 1 further comprising an intrinsic diamond sensor usable to detect emitted, shifted, harmonically generated, or reflected electromagnetic waves from a surface of a sample.

15. The SPM device of claim 1 wherein:
the tip has an aperture surrounding the axis of the tip; and
the axis of the tip passes through the lower surface's aperture such that the particle beam passes through the lower surface's aperture and through the aperture of the tip.

16. The SPM device of claim 1 wherein the axis of the tip is displaced from the lower surface's aperture such that the particle beam passes through the lower surface's aperture at a point in the plane of the lower surface that is displaced from the axis of the tip.

17. A scanning probe microscopy (SPM) device comprising:
a body having a cavity region extending between an upper surface and a lower surface formed in a semiconductor device;
a tip extending downward below at least a portion of the lower surface;
a first electrode disposed near at least a portion of the lower surface; and
a second electrode disposed within the cavity region, wherein:
the second electrode is configured to emit a charged-particle beam directed toward the first electrode;

the charged-particle beam travels along a particular direction that is coaxial with the axis of the tip; and the particular direction is perpendicular to the upper and lower surfaces, and the particle beam passes through the first electrode's aperture.

18. A scanning probe microscopy (SPM) device comprising:
   a body having a cavity region extending between an upper surface and a lower surface;
   a tip extending downward below at least a portion of the lower surface, the tip having an axis;
   a first electrode disposed near at least a portion of the lower surface; and
   a second electrode disposed within the cavity region, wherein:
      the second electrode is configured to emit a charged-particle beam directed toward the first electrode;
      the charged-particle beam travels along a particular direction that is perpendicular to the upper and lower surfaces;
      the charged-particle beam travels along a particular direction that is laterally displaced from the axis of the tip; and
      the particular direction is perpendicular to the upper and lower surfaces, and the particle beam passes through the first electrode's aperture.

19. A scanning probe microscopy (SPM) device comprising:
   a body having a cavity region extending between an upper surface and a lower surface formed in a semiconductor device;
   a tip extending downward below at least a portion of the lower surface, the tip having a closed end;
   a first electrode disposed near at least a portion of the lower surface, the first electrode being formed with an aperture; and
   a second electrode disposed within the cavity region wherein:
      the second electrode is configured to emit a charged-particle beam directed toward the first electrode; and
      the charged-particle beam passes through the first electrode's aperture and exits the closed end of the tip.

* * * * *